United States Patent
Han

(10) Patent No.: US 7,626,194 B2
(45) Date of Patent: Dec. 1, 2009

(54) ACTIVE MATRIX TYPE ORGANIC ELECTRO LUMINESCENCE DISPLAY DEVICE INCLUDING A LOW REFRACTIVE THIN FILM AND METHOD OF FABRICATING THE SAME

(75) Inventor: Chang Wook Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1253 days.

(21) Appl. No.: 10/607,029

(22) Filed: Jun. 27, 2003

(65) Prior Publication Data
US 2004/0004224 A1 Jan. 8, 2004

(30) Foreign Application Priority Data
Jul. 8, 2002 (KR) ............... 10-2002-0039475

(51) Int. Cl.
*H01L 51/00* (2006.01)
(52) U.S. Cl. ................. 257/40; 257/E51.018
(58) Field of Classification Search ........... 257/40, 257/44, 72, 347, E51.018; 438/48, 128, 149, 438/151, 157, 283, 479, 517; 349/42, 43, 349/44, 45, 46, 47, 48
See application file for complete search history.

(56) References Cited
U.S. PATENT DOCUMENTS

| | | | | |
|---|---|---|---|---|
| 5,313,075 A | * | 5/1994 | Zhang et al. | |
| 5,811,352 A | * | 9/1998 | Numata et al. | |
| 6,186,650 B1 | * | 2/2001 | Hulse et al. | |
| 6,218,682 B1 | * | 4/2001 | Zucker et al. | |
| 6,455,878 B1 | * | 9/2002 | Bhat et al. | 257/99 |
| 6,492,778 B1 | * | 12/2002 | Segawa | 315/169.3 |
| 6,538,390 B2 | * | 3/2003 | Fujita et al. | |
| 6,597,121 B2 | | 7/2003 | Imura | |
| 6,762,553 B1 | * | 7/2004 | Yokogawa et al. | 313/509 |
| 6,839,108 B1 | * | 1/2005 | Hirakata et al. | 349/114 |
| 6,858,898 B1 | * | 2/2005 | Hayakawa et al. | 257/347 |
| 2002/0105267 A1 | * | 8/2002 | Mochizuki et al. | |
| 2003/0001488 A1 | * | 1/2003 | Sundahl | 313/483 |
| 2003/0027369 A1 | | 2/2003 | Yamazaki | |
| 2003/0127974 A1 | | 7/2003 | Miyazawa | |
| 2004/0227148 A1 | * | 11/2004 | Camras et al. | 257/99 |

FOREIGN PATENT DOCUMENTS

| | | |
|---|---|---|
| KR | 2001-0060297 | 7/2001 |
| KR | 2002-0033078 | 5/2002 |

* cited by examiner

*Primary Examiner*—Sue Purvis
*Assistant Examiner*—Kevin Quinto
(74) *Attorney, Agent, or Firm*—Morgan Lewis & Bockius LLP

(57) ABSTRACT

An active matrix organic electro luminescence display panel device includes a substrate, at least one low refractive thin film formed on the substrate, and an organic electro luminescence diode formed on the low refractive thin film to selectively emit light. Also, a method of fabricating an active matrix organic electro luminescence display panel device includes the steps of forming at least one low refractive thin film on a substrate, and forming an organic electro luminescence diode on the low refractive thin film to selectively emit light.

8 Claims, 21 Drawing Sheets

ION DOPING

ACTIVE MATRIX TYPE ORGANIC ELECTRO LUMINESCENCE DISPLAY DEVICE INCLUDING A LOW REFRACTIVE THIN FILM AND METHOD OF FABRICATING THE SAME

The present invention claims the benefit of Korean Patent Application No. P2002-039475 filed in Korea on Jul. 8, 2002, which is hereby incorporated by reference.

BACKGROUND OF THE INVENTION

1. Field of the Invention

The present invention relates to an organic electro luminescence (EL) display panel device and a method of fabricating the same, and more particularly to an active matrix type organic electro luminescence display panel device and a method of fabricating the same having extended life span and improved light emission efficiency.

2. Discussion of the Related Art

In general, an organic EL display panel device is a passive matrix type or an active matrix type. A passive matrix type organic EL display panel device does not include thin film transistors (TFTs) separately. In the passive matrix type organic EL display panel device, gate lines cross data lines to form a matrix and the gate lines are sequentially driven to drive each pixel of the device. However, an instantaneous brightness is required to produce an average brightness across a number of lines to display images. Thus, if there are more lines in the device, higher voltage and current also required. Therefore, the passive matrix type organic EL display panel device has limited resolution, power dissipation and life span.

In contrast, an active matrix type organic EL display panel device includes a thin film transistor located at each pixel functioning as a switch for opening and shutting each pixel. A voltage applied to the pixel is charged to a storage capacitor and the charged voltage in the storage capacitor acts to apply power source until the next frame signal is applied. Thus, the active matrix type organic EL display panel device is driven for one frame period regardless of the number of gate lines. Therefore, the active matrix type organic EL display panel device has better resolution, power dissipation and life span in comparison to a passive matrix type organic EL display panel device.

FIG. 1 is a diagram of a pixel structure of an active matrix type organic EL display panel device according to a related art. In FIG. 1, the basic pixel structure of the active matrix type organic EL display panel device includes a gate line GL formed in a first direction; a power supply line VDD and a data line DL formed in parallel in a second direction crossing the first direction at a predetermined interval; and a pixel area defined by the crossing of the gate line GL, the data line DL and the power supply line VDD. In addition, the active matrix type organic EL display panel device includes a switching thin film transistor STFT connected to a storage capacitor Cst and the power supply line VDD, and an organic EL diode OLED connected to a drive thin film transistor MTFT. The switching TFT STFT controls the drive of the drive TFT MTFT in response to a selection signal from the gate line GL.

In the organic EL diode OLED, if an organic luminous material is supplied with a forward current, holes and electrons are moved to a light emission layer formed between a hole transport layer and an electron transport layer through a hole injection layer, the hole transport layer, the electron transport layer and an electron injection layer that are deposited between an anode electrode supplying holes and a cathode electrode supplying electrons. The moved holes and electrons are combined together within the light emission layer to generate a designated energy, which causes to emit light.

Further, if a signal is applied to a pertinent electrode in accordance with the selection signal, the switching TFT STFT is turned on. At this moment, a data signal is applied to the drive TFT MTFT and the storage capacitor Cst through the switching TFT STFT. If the drive TFT MTFT is on, a current from the power supply line VDD is applied to an organic EL layer through the drive TFT MTFT. In this case, the open and close time of the drive TFT MTFT becomes different in accordance with the size of the data signal, gray levels can be expressed by way of controlling the amount of current flowing through the drive TFT MTFT. Thus, the organic EL display panel can emit light continuously until the signal of the next frame is applied after a data charged in the storage capacitor Cst is continuously applied to the drive TFT MTFT.

According to the driving principle, the active matrix type organic EL display panel can apply the voltage lower and the current instantaneously lower than the passive matrix type organic EL display panel, and the organic EL display panel can be continuously driven for one frame period regardless of the number of selected lines. Thus, the active matrix type organic EL display panel is advantageous for low power dissipation, high resolution and a large screen. On the other hand, the active matrix type organic EL display panel has a structure where a current flows through a TFT, a polycrystalline silicon p-Si TFT is required which has a uniform crystalline state so as for the electric field effect mobility to be excellent because the related art amorphous silicon a-Si TFT is difficult to be adopted because silicon particles of non-crystalline state of the amorphous silicon causes electric field effect mobility to be low.

The polycrystalline silicon TFT has high electric field effect mobility, thus a drive circuit can be made on a substrate. Hereby, when the drive circuit is made on the substrate with the polycrystalline silicon TFT, the cost and mounting of the drive integrated circuit IC can be simplified. Polycrystalline silicon commonly is formed using a low temperature crystallization method including laser annealing of amorphous silicon.

FIG. 2 is a sectional view of an active matrix type organic EL display panel device according to the related art. In FIG. 2, the organic EL display pane device includes an insulating substrate 1, a buffer layer 30 formed on an entire surface of the substrate 1, a thin film transistor T formed in a first region of the buffer layer 30, a storage capacitor Cst formed in a second region of the buffer layer 30, and an organic EL diode E formed in a light emission region I on the substrate 1. The thin film transistor T includes an active layer 32 formed on the buffer layer 30, a gate electrode 38 formed on the active layer 32, and source and drain electrodes 50 and 52 on the active layer 32. The storage capacitor Cst includes a capacitor electrode 34 formed on the buffer layer 30 and a power electrode 42 formed opposite to the capacitor electrode 34 with a first insulating layer 40 therebetween. In addition, the organic EL diode E includes an anode 58 formed on a third insulating layer 54, and a cathode 66 formed opposite to the anode with an organic EL layer 64 therebetween.

In addition, the source electrode 50 of the thin film transistor T extends over a second insulating layer 44 and contacts the power electrode 42 of the storage capacitor Cst. Also, the anode 58 of the organic EL diode E extends over the third insulating layer 54 and contacts the drain electrode of the thin film transistor T.

FIGS. 3A-3I are sectional views of a method of fabricating the active matrix type organic EL display panel device of FIG.

2. In FIG. 3A, the buffer layer 30 is first formed on an entire surface of the insulating substrate 1. The buffer layer 30 is formed by depositing a first insulating material on the substrate 1. Then, the active layer 32a and the capacitor electrode 34 are formed on the buffer layer 30. The active layer 32a and the capacitor electrode 34 are formed by depositing polycrystalline silicon on the buffer layer 30 and patterned by a first mask process.

In FIG. 3B, a gate insulating film 36 and the gate electrode 38 are formed at a central area of the active layer 32a. The gate insulating film 36 and the gate electrode 38 are formed by depositing a second insulating material and patterned by a second mask process.

In FIG. 3C, the first insulating layer 40 is formed on the entire surface of the substrate 1 by depositing a third insulating material. Then, the power electrode 42 is formed on the first insulating layer 40 above the capacitor electrode 34.

In FIG. 3D, the second insulating layer 44 is formed on the entire surface of the substrate 1 by depositing a fourth insulating material and patterned. The second insulating layer 44 is patterned to form first and second ohmic contact holes 46a and 46b exposing regions 32b of the active layer 32a. The second insulating layer 44 is also patterned to expose a portion 48 of the power electrode 42. Then, the substrate 1 undergoes an ion doping process, thereby forming source and drain areas 1a and 1b containing impurities.

In FIG. 3E, the source and drain electrodes 50 and 52 are formed in the first and second ohmic contact holes 46a and 46b (shown in FIG. 3D) by depositing a third metal material and patterned by a fifth mask process. The source electrode 50 extends over the second insulating layer 44 and contacts the exposed region 48 (shown in FIG. 3D) of the power electrode 42.

In FIG. 3F, the third insulating layer 54 is formed on the substrate by depositing a fourth insulating material and patterned by a sixth mask process. The third insulating layer 54 is patterned to form a drain contact hole 56 exposing a portion of the drain electrode 52.

In FIG. 3G, the anode 58 is formed on the substrate 1 by depositing a transparent conductive material and patterned by a seventh mask process. The anode 58 is on the third insulating layer 54 and contacts the drain electrode 52 through the drain contact hole 56 (shown in FIG. 3F).

In FIG. 3H, a protective layer 60 is formed on the substrate 1 by depositing a fifth insulating material and patterned by an eighty mask process. The protective layer exposes a portion 62 of the anode 58. The protective layer 60 covers the thin film transistor T and protects the thin film transistor T from moisture and impurities.

In FIG. 3I, the organic EL layer 64 and the cathode 66 is formed on the substrate 1. In particular, the organic EL layer 64 contacts the exposed portion 62 (shown in FIG. 3H) of the anode 58, and the cathode 66 is formed on the entire surface of the substrate 1.

Accordingly, the organic EL display panel has a lower light emission scheme where a light emitted in the organic EL layer 64 comes out toward the substrate 1. Accordingly, its light transmittance is deteriorated because light is transmitted through the first to third insulating layers 40, 44 and 54 and the buffer layer 30. In addition, the organic EL display panel has a reduced light emission efficiency. For example, Formula 1 calculates the light emission efficiency of the organic EL display panel based on optics principles.

$$\eta_{extl}=1/(2n^2)\times\eta_{intl}=1/(2\times1.5^2)=1/5\sim20\%$$ [Formula 1]

'η' represents internal or external light emission efficiency, and 'n' represents the refractive rate of a pertinent substrate. The refractive rate n of a substrate on which a buffer layer and an insulating layer are deposited in the related art is 1.5. Thus, in the organic EL display panel according to the related art, there is a disadvantage in that only 20% of the light emitted from the organic EL layer 64 to be transmitted through the substrate 1 is utilized on the display panel.

SUMMARY OF THE INVENTION

Accordingly, the present invention is directed to an active matrix type organic electro luminescence display panel device and a method of fabricating the same that substantially obviates one or more of the problems due to limitations and disadvantages of the related art.

An object of the present invention is to provide an active matrix type organic electro luminescence display panel device and a method of fabricating the same having extended life span and improved light emission efficiency.

Another object of the present invention is to provide an active matrix type organic electro luminescence display panel device and a method of fabricating the same having an organic electro luminescence diode capable of changing the positions of its anode and cathode depending on the characteristic of carriers applied supplied by the thin film transistor, thereby providing uniform brightness.

Another object of the present invention is to provide an active matrix type organic electro luminescence display panel device and a method of fabricating the same without employing inorganic insulating films in a light emission region, thereby improving light emission efficiency and brightness.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the active matrix organic electro luminescence display panel device includes a substrate, at least one low refractive thin film formed on the substrate, and an organic electro luminescence diode formed on the low refractive thin film to selectively emit light.

In another aspect, the method of fabricating an active matrix organic electro luminescence display panel device includes the steps of forming at least one low refractive thin film on a substrate, and forming an organic electro luminescence diode on the low refractive thin film to selectively emit light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
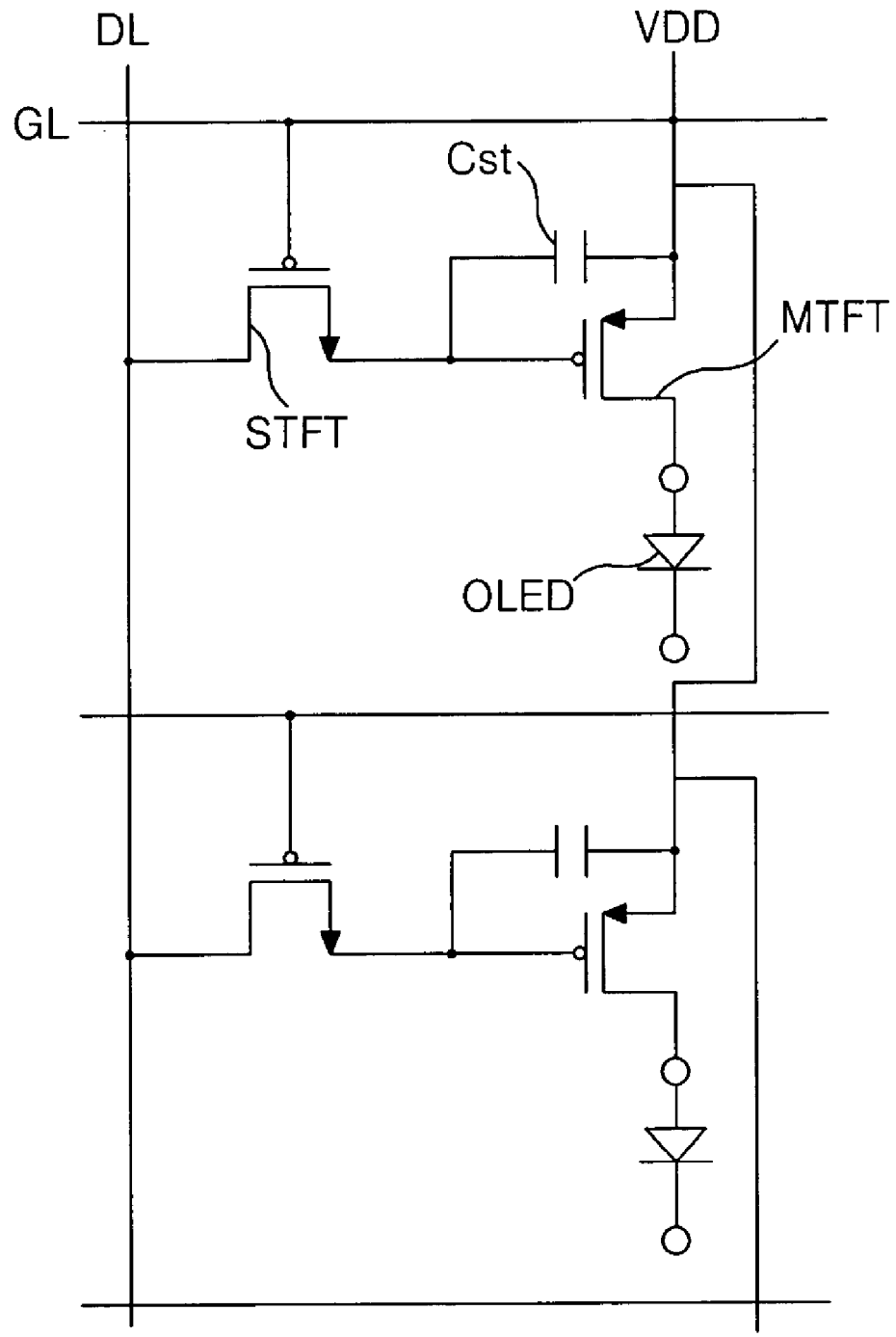
FIG. 1 is a diagram of a pixel structure of an active matrix type organic EL display panel device according to a related art.
Figure 2:
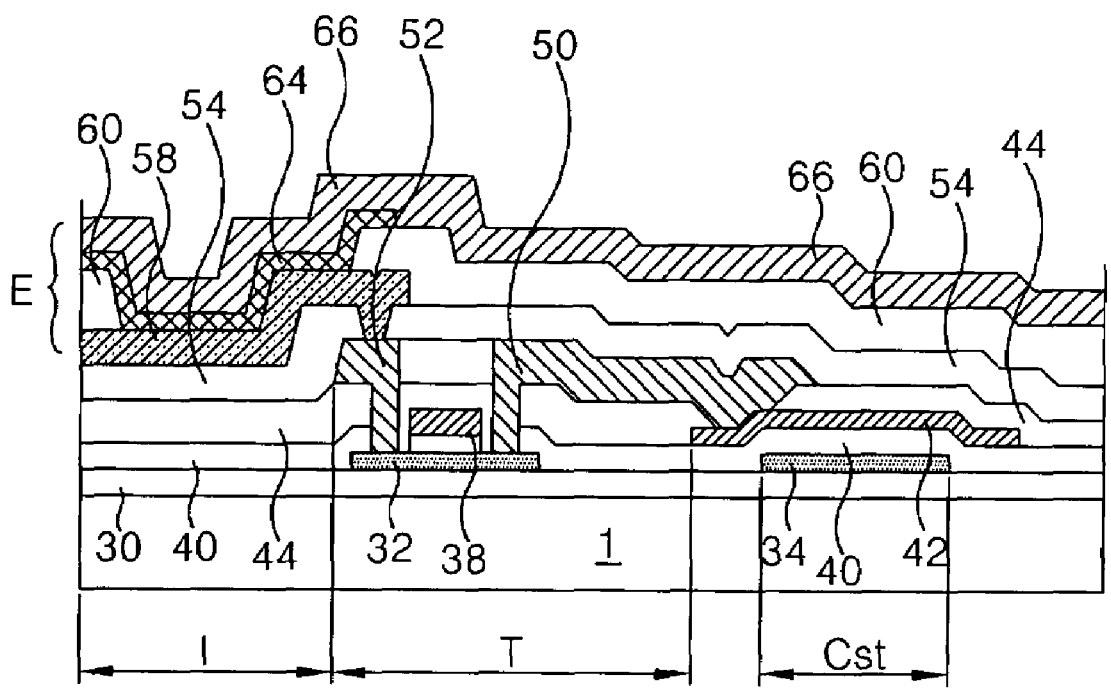
FIG. 2 is a sectional view of an active matrix type organic EL display panel device according to the related art.
Figure 3A:
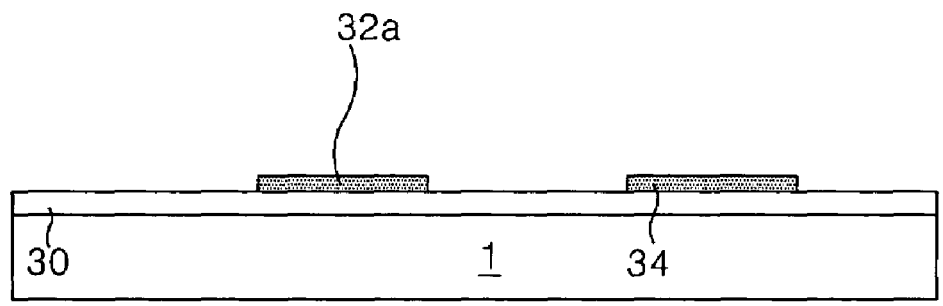
FIGS. 3A-3I are sectional views of a method of fabricating the active matrix type organic EL display panel device of FIG. 2.
Figure 3B:
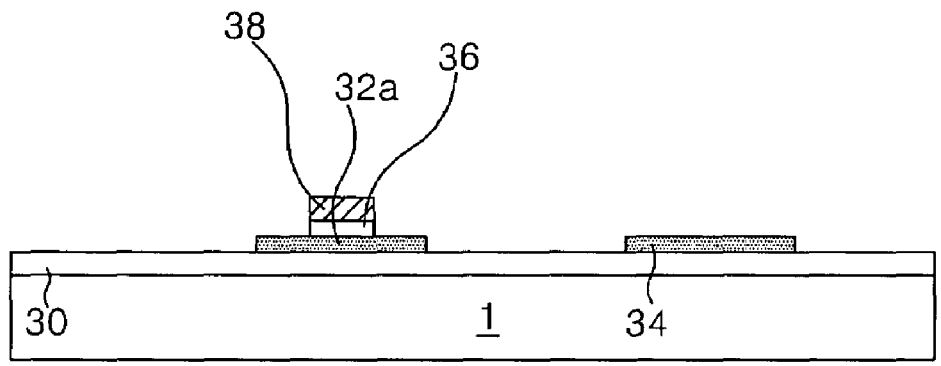
Figure 3C:
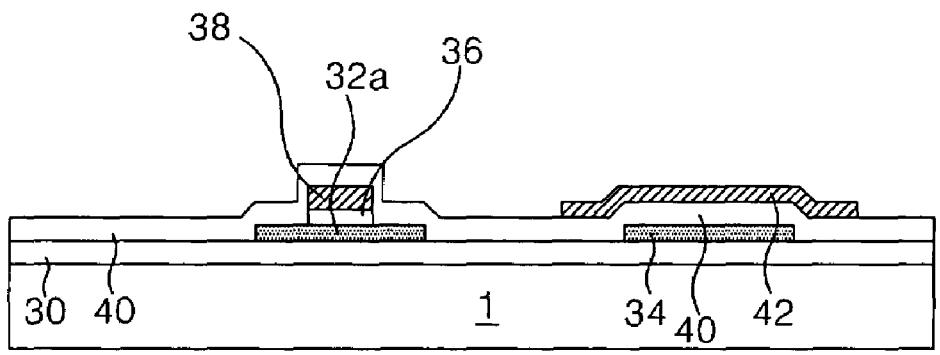
Figure 3D:
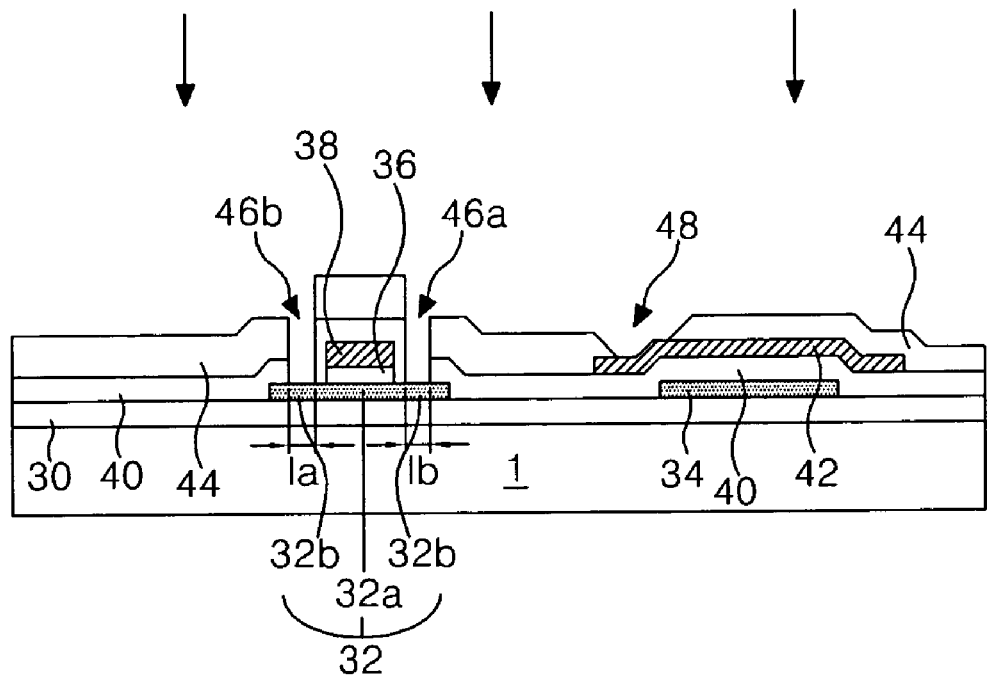
Figure 3E:
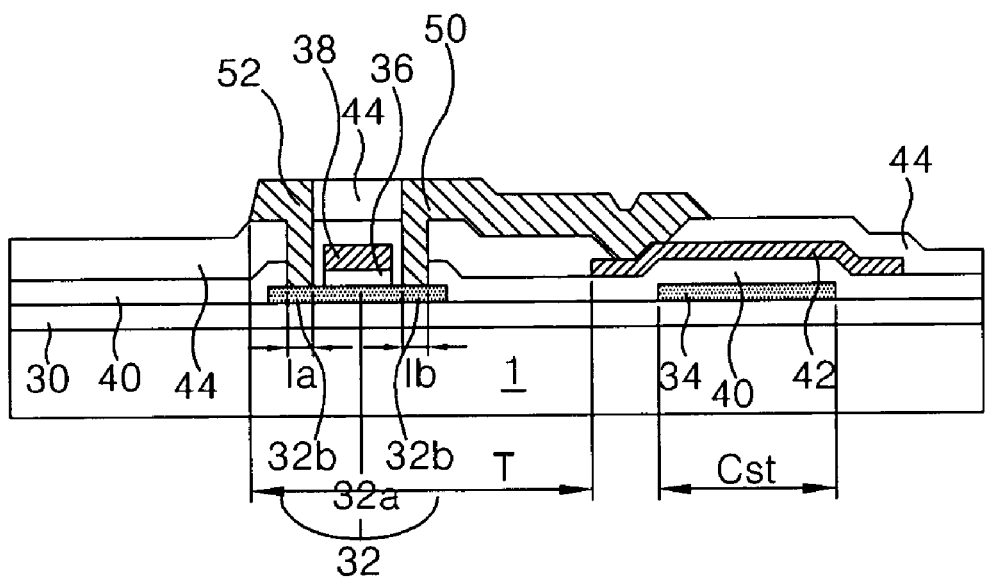
Figure 3F:
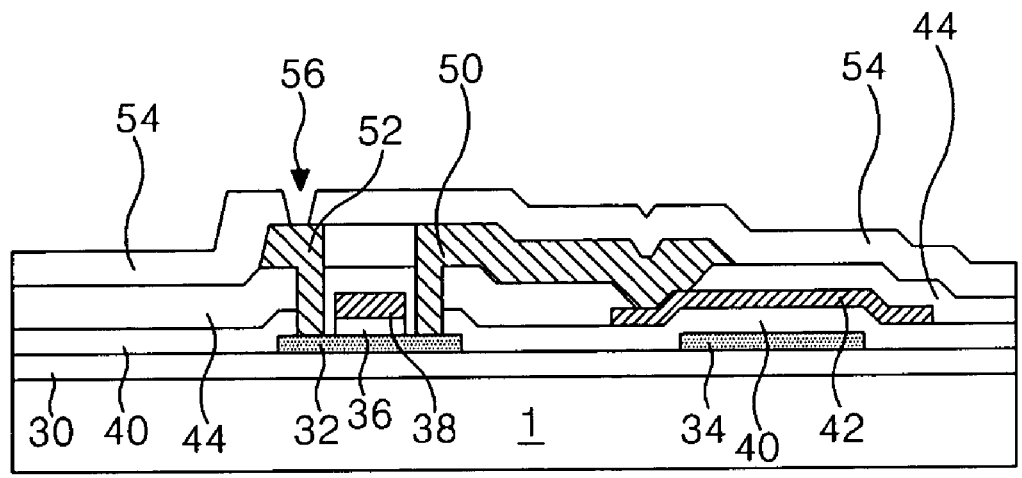
Figure 3G:
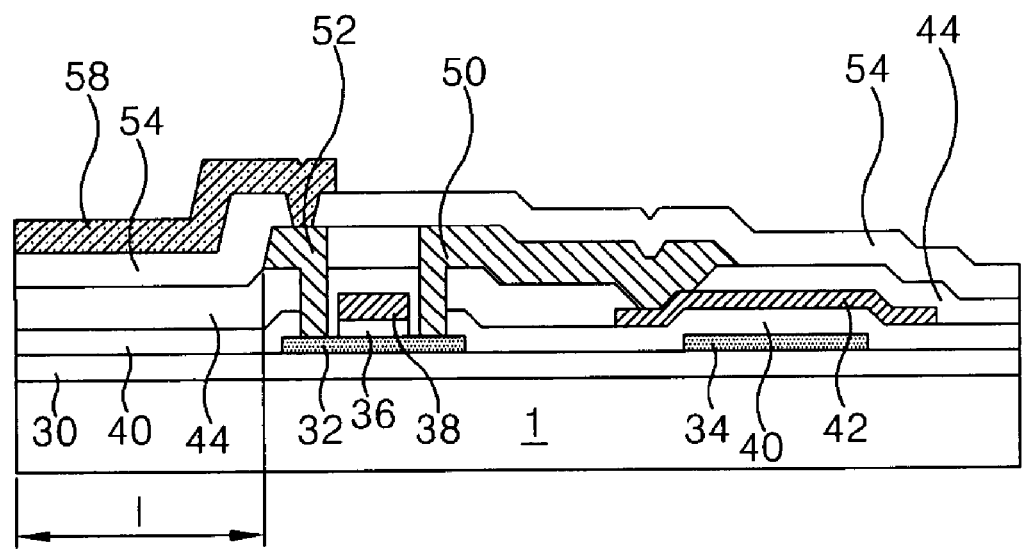
Figure 3H:
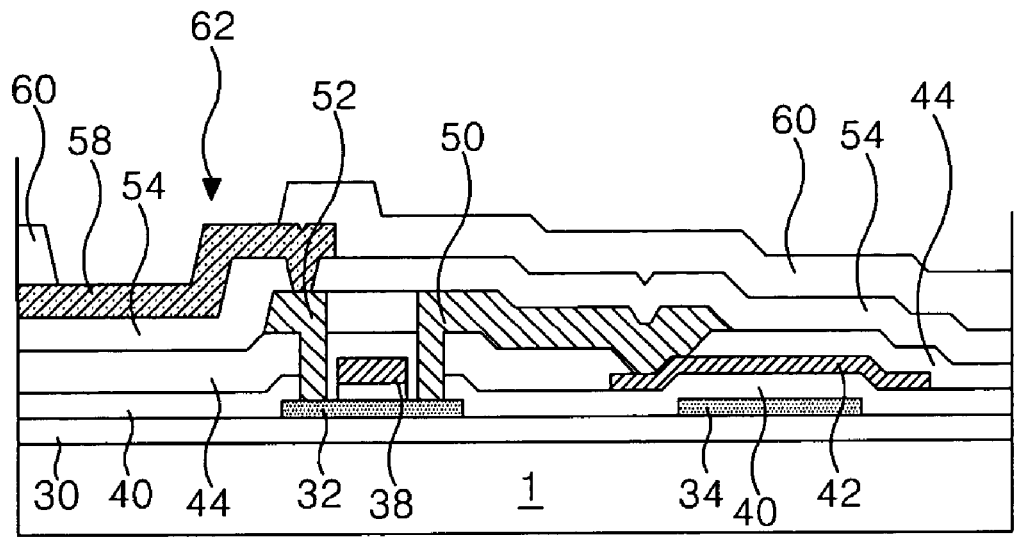
Figure 3I:
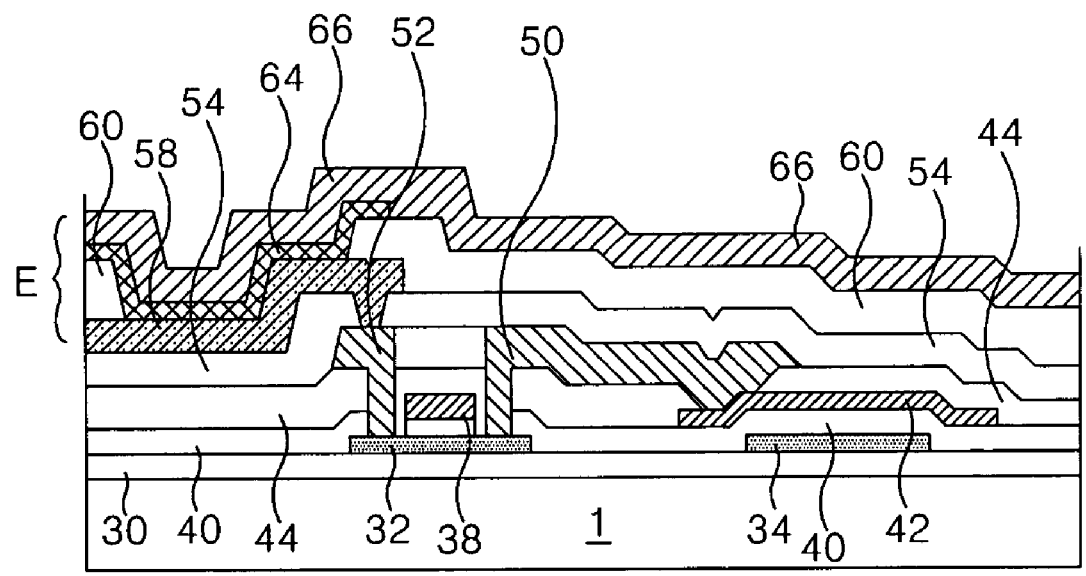
Figure 4:
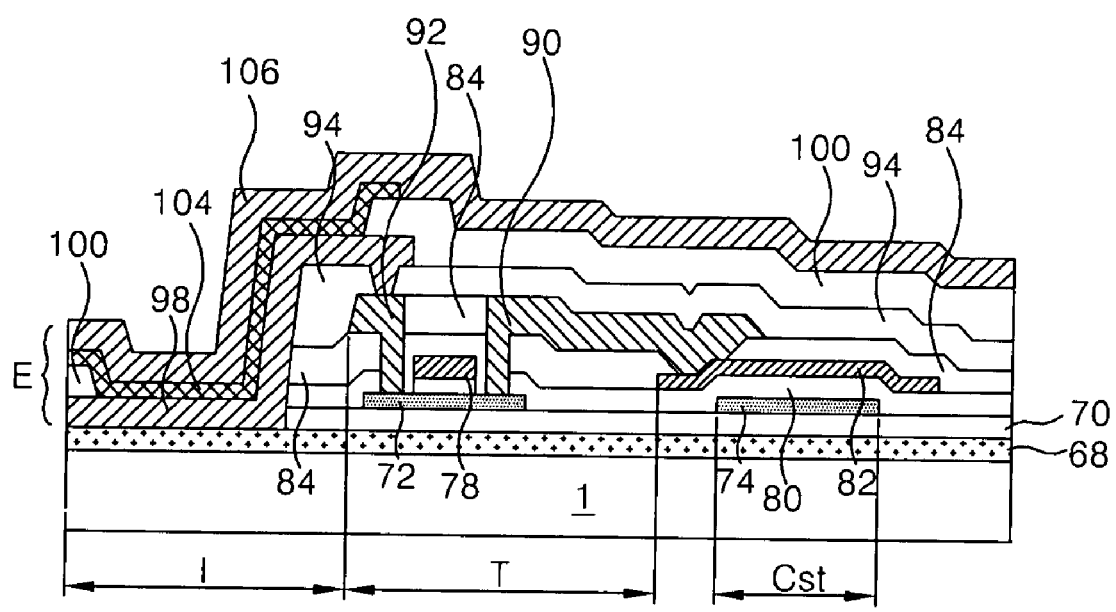
FIG. 4 is a sectional view of an exemplary active matrix type organic EL display panel device according to the present invention.

FIG. 4 is a sectional view of an exemplary active matrix type organic EL display panel device according to the present invention. In FIG. 4, an active matrix type organic EL display panel device may be arranged in a similar manner as shown in FIG. 1 of the related art. In addition, the active matrix type organic EL display panel device may include an insulating substrate 1, a low refractive thin film 68 formed on an entire surface of the insulating substrate 1, a buffer layer 70 formed on the low refractive thin film 68, a thin film transistor T formed on a first region of the buffer layer 70, a storage capacitor Cst formed on a second region of the buffer layer 70, and an organic EL diode E formed on the substrate 1 in a light emitting region I of the low refractive thin film 68. Further, the storage capacitor Cst and the organic EL diode E may be electrically connected to the thin film transistor T.

The thin film transistor T may have a deposition structure including a semiconductor layer 72 formed on the buffer layer 70, a gate electrode 78 formed on the semiconductor layer 72, and source and drain electrodes 90 and 92 formed on the semiconductor layer 72. In addition, the storage capacitor Cst may include a capacitor electrode 74 formed on the buffer layer 70, and a power electrode 82 formed opposite to the capacitor electrode 74 with a first insulating layer 80 therebetween. Further, the organic EL diode E may include an anode 98 formed on the low reflective thin film 68, and a cathode 106 formed opposite to the anode 98 with an organic EL layer 104 therebetween. A protection layer 100 also may be formed between a portion of the organic EL layer 104 and the anode 98. The anode 98 may be formed of a transparent conductive material, and the cathode 106 may be formed of a metal having a low work function.

Also, the organic EL layer 104 may include a hole injection layer (not shown), a hole transport layer (not shown), an electron transport layer (not shown), and an electron injection layer (not shown) formed sequentially between the anode and cathode 98 and 106. If a current is applied between the anode 98 and the cathode 106, carriers including electrons and holes may be injected through the hole injection layer and the electron injection layer. Such carriers are transported to a light emission layer (not shown) formed between the hole transport layer and the electron transport layer through the hole transport layer and the electron transport layer. At this moment, the hole transport layer and the electron transport layer transport the carriers to a light emission material to increase a probability of light emission combination within the light emission layer. If the carriers are injected, excitons are generated within the light emission layer, and the generated excitons emit the light corresponding to a polaron energy gap to become extinct. Accordingly, the generated light is radiated toward the insulating substrate 1.

In addition, the source electrode 90 of the thin film transistor T may extend over a second insulating layer 84, such that a portion of the source electrode 90 contacts the power electrode 82 of the storage capacitor Cst. Also, the anode 98 of the organic EL diode E may extend over a third insulating layer 94, such that a portion of the anode 98 contacts the drain electrode 92 of the thin film transistor T. In particular, when a gate signal applied by a gate line GL (shown in FIG. 1) of the organic EL display panel device is enabled, the thin film transistor may be electrically connected to the storage capacitor Cst and the organic EL diode E. Subsequently, the organic EL diode E may emit light corresponding to a pixel signal applied by a data line DL (shown in FIG. 1) of the organic EL display panel device. Accordingly, the organic EL display panel device may have a lower light emission scheme where an emitted light is transmitted through the anode 98, which is a lower electrode of the organic EL diode E. For example, the anode 98 may transmit the emitted light at the organic EL layer 104, the cathode 106 may inject electrons smoothly into the organic EL layer 104 because of its low work function.

Further, the low refractive thin film 68 may be formed of a material with low refractive rate, such as silica aerogel or silica gel. In particular, the low refractive thin film 68 may be formed of silica aerogel with a refractive rate of 1.07. Accordingly, the low refractive thin film 68 may reduce a refraction of light being emitted by the organic EL diode E. For instance, the display panel device may have improved light emission efficiency of about 2.5 times better than the panel device of the related art as calculated by Formula 2.

$$\eta_{ext}=1/(2n^2)\times\eta_{int}=1/(2\times1.07^2)\sim1/(2\times1^2)=\frac{1}{2}=50\% \quad \text{[Formula 2]}$$

'η' represents internal or external light emission efficiency, and 'n' represents the refractive rate of a pertinent substrate.

Accordingly, in the active matrix type organic EL display panel device according to the present invention, light emitted from the light emission layer of the organic EL layer 104 may be radiated through the substrate 1, i.e., be display on a screen of the display pane device, without transmitting through an insulating layer, thereby improving brightness and brightness uniformity. Also, light emission is not dispersed, because of its passage through the low refractive thin film 68, thereby utilizing more of the screen of the display panel device and improving light emission efficiency.

Figure 5A:
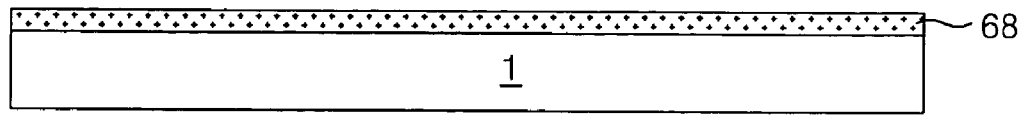
FIGS. 5A-5J are sectional view of an exemplary method of fabricating the active matrix type organic EL display panel device of FIG. 4.

FIGS. 5A-5I are sectional view of an exemplary method of fabricating the active matrix type organic EL display panel device of FIG. 4. In FIG. 5A, the low refractive thin film 68 may be first formed on the entire surface of the insulating substrate 1 by depositing one of silica aerogel and silica gel.

Figure 5B:
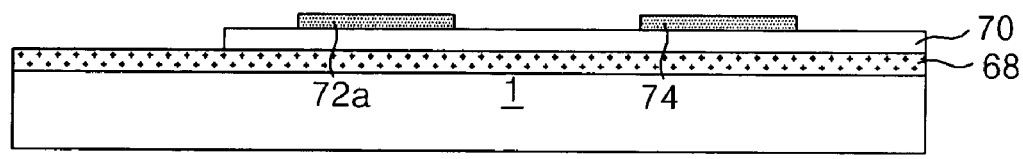

In FIG. 5B, the buffer layer 70 may be formed on a portion of the low refractive thin film 68. The buffer layer 70 may be formed by depositing a first insulating material on an entire surface of the low refractive thin film 68 and patterned by a first mask process, such that the buffed layer 70 is on the substrate 1 except in a portion of the light emission region I. A mask process may employ a photolithography including coating a photo resist layer, aligning, exposing the photo resist layer and developing. Then, the semiconductor layer 72 and the capacitor electrode 74 may be formed simultaneously or sequentially by depositing polycrystalline silicon on an entire surface of the buffer layer 70 and patterned by a second mask process.

Figure 5C:
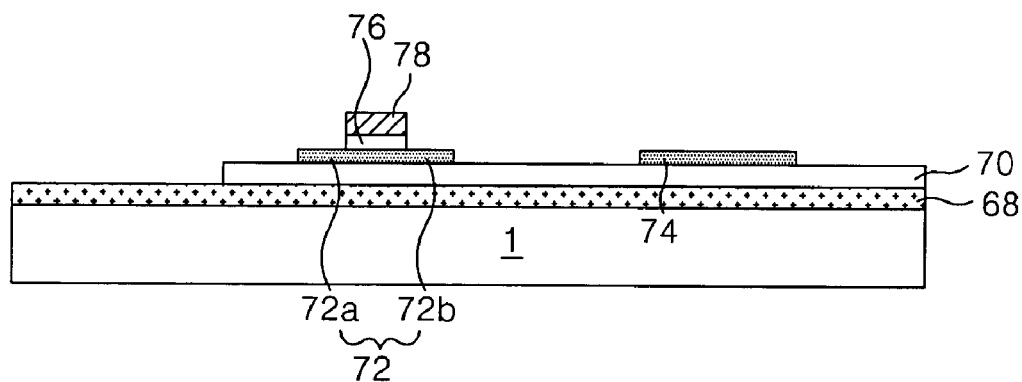

In FIG. 5C, a gate insulating film 76 and the gate electrode 78 may be formed on a central region of the semiconductor layer 72. The gate insulating layer 76 and the gate electrode 78 may be formed by sequentially depositing a second insulating material and a first metal material on the semiconductor layer 72 and patterned by a third mask process, such that the semiconductor layer 72 has two exposed regions 72a and 72b.

Figure 5D:
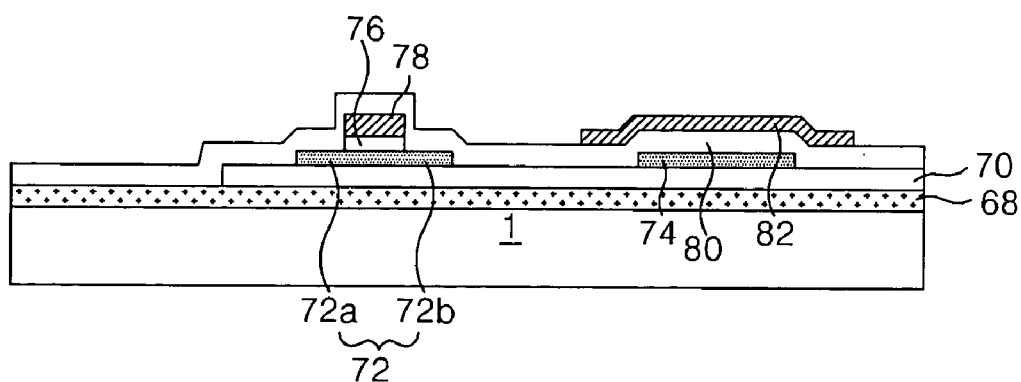

In FIG. 5D, the first insulating layer 80 may be formed on the entire surface of the substrate 1 covering the low refractive thin film 68, the buffer layer 70, the semiconductor layer 72, the gate electrode 78, and the capacitor electrode 74. The first insulating layer 80 may be formed by depositing a third insulating material on the entire surface of the substrate 1 except in the portion of the light emission region I similar to the buffer layer 70. Then, the power electrode 82 may be formed on the first insulating layer 80 above the capacitor electrode 74. The power electrode 82 may be formed by depositing a second metal material on the first insulating layer 80 and patterned by a fourth mask process.

Figure 5E:
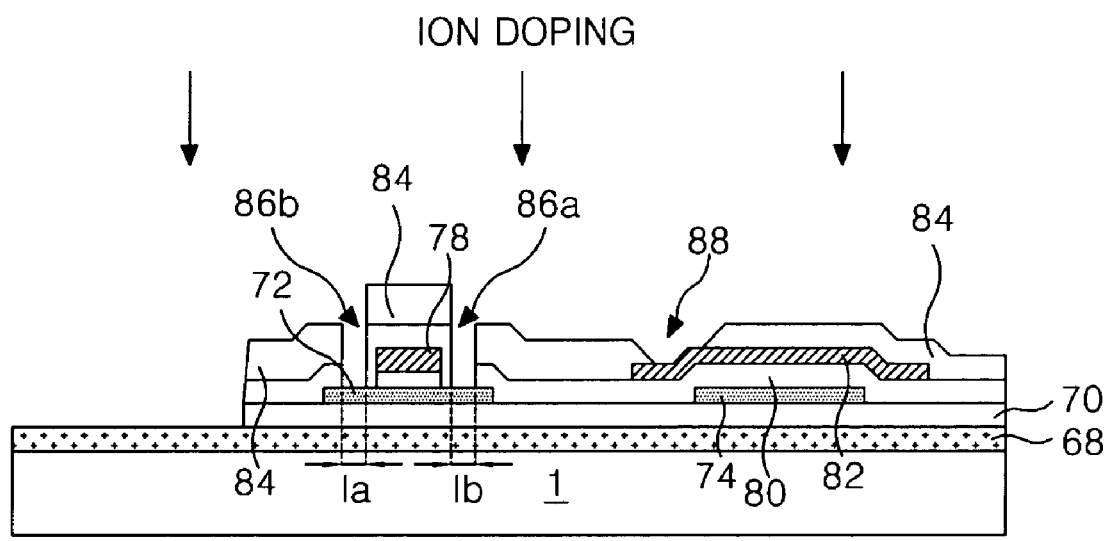

In FIG. 5E, the second insulating layer 84 may be formed selectively on the substrate 1 by depositing a third insulating material on the substrate 1 and patterned by a fifth mask process. In particular, the second insulating layer 84 may be on the entire surface of the substrate 1 except in the portion of the light emission region I similar to the buffer layer 70 and the first insulating layer 80. In addition, the first and second insulating layers 80 and 84 may be further patterned to form first and second ohmic contact holes 86a and 86b exposing the regions 72a and 72b of the semiconductor layer 72. Further, the second insulating layer 84 may be further patterned to form a capacitor contact hole 88 exposing a region of the power electrode 82. Then, the substrate 1 may undergo an ion doping process, thereby forming source and drain areas Ia and Ib containing impurities.

Figure 5F:
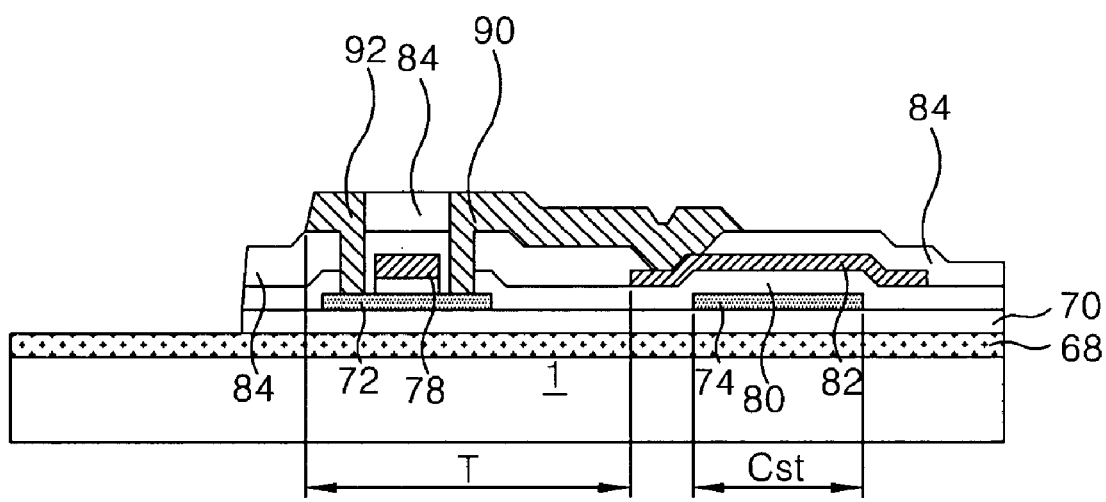

In FIG. 5F, the source and drain electrodes 90 and 92 may be formed in the first and second ohmic contact holes 86a and 86b (shown in FIG. 5E). The source and drain electrodes 90 and 92 may be formed by depositing a third metal material and patterned by a sixth mask process, such that the source electrode 90 extends over the second insulating layer 84 contacting the exposed region of the power electrode 82 through the capacitor contact hole 88 (shown in FIG. 5E). Accordingly, the thin film transistor T and the storage capacitor Cst may be completely formed on the substrate 1. In particular, the capacitor electrode 74 may connect to the gate electrode 78, and the power electrode 82 may be connected to a power supply line VDD (shown in FIG. 1) and be parallel to a data line DL (shown in FIG. 1).

Figure 5G:
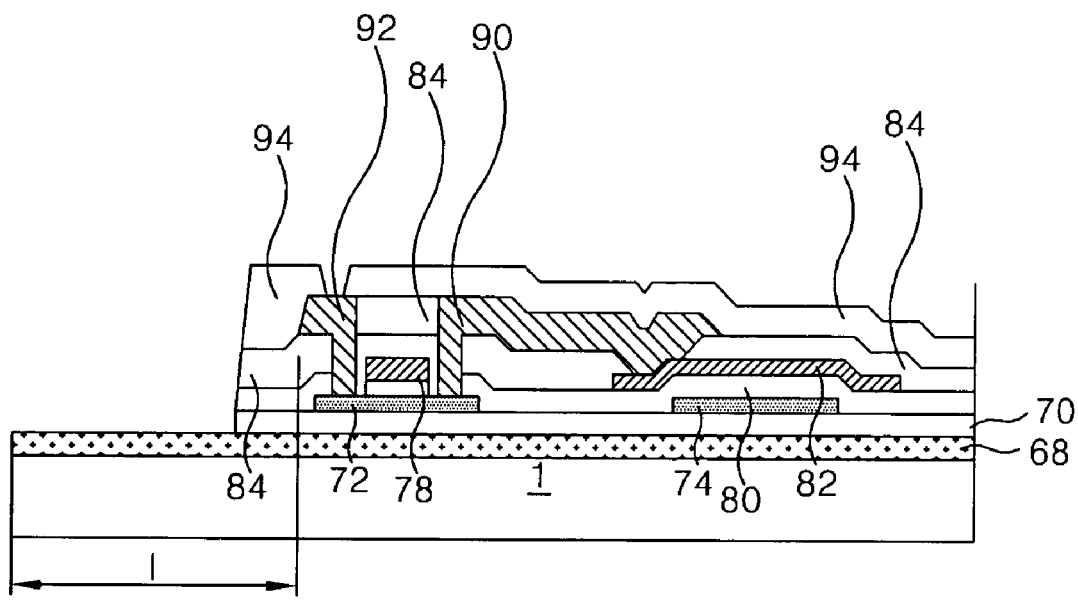

In FIG. 5G, the third insulating layer 94 may be formed on the substrate 1 by depositing a fourth insulating material on the entire surface of the substrate 1 and patterned by a seventh mask process, such that the third insulating layer is on the substrate 1 except in the portion of the light emission region I similar to the buffer layer 70, the first insulating layer 80 and the second insulating layer 84. The third insulating layer 94 may be further patterned to expose a portion of the drain electrode 92.

Figure 5H:
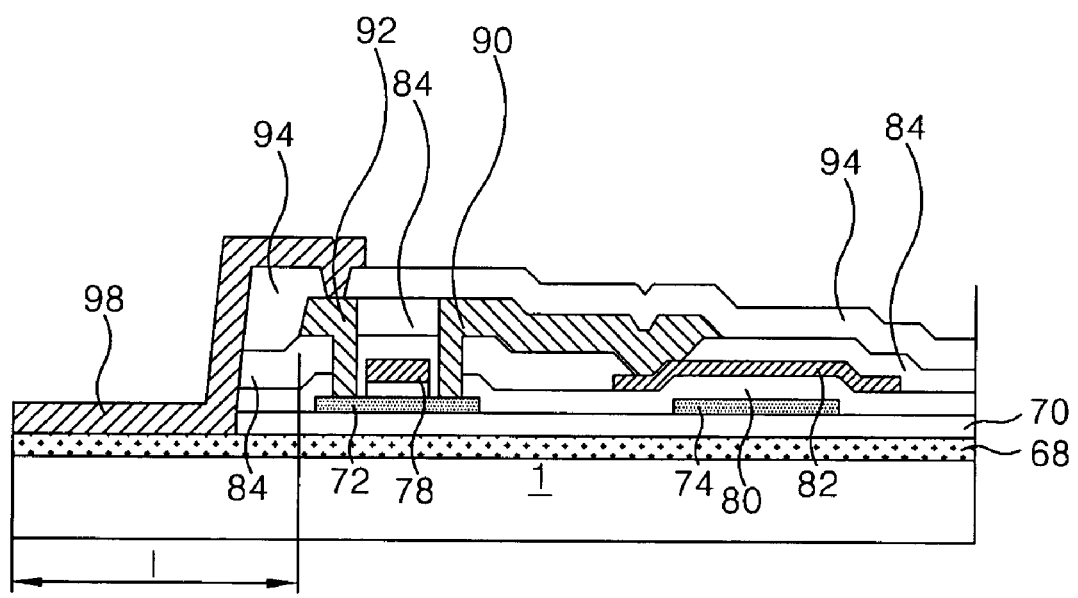

In FIG. 5H, the anode 98 may be formed within the light emission region I and on the third insulating layer 94 contacting the exposed portion of the drain electrode 92. The anode 98 may be formed by depositing a transparent conductive material on the substrate 1 and patterned by an eighth mask process.

Figure 5I:
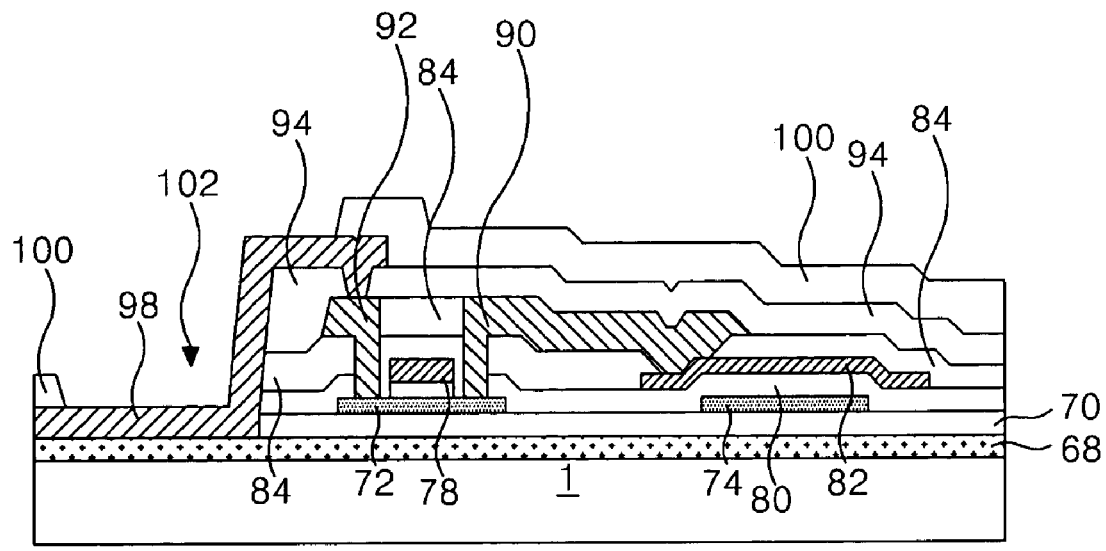

In FIG. 5I, the protection layer 100 may be formed on the substrate 1 by depositing a fifth insulating material on the entire surface of the substrate 1 and patterned by a ninth mask process. The protection layer 100 may be patterned to partially cover the anode 98 and to expose a region 102. Also, the protection layer 100 may cover the thin film transistor T, thereby protecting the thin film transistor T from moisture and impurities.

Figure 5J:
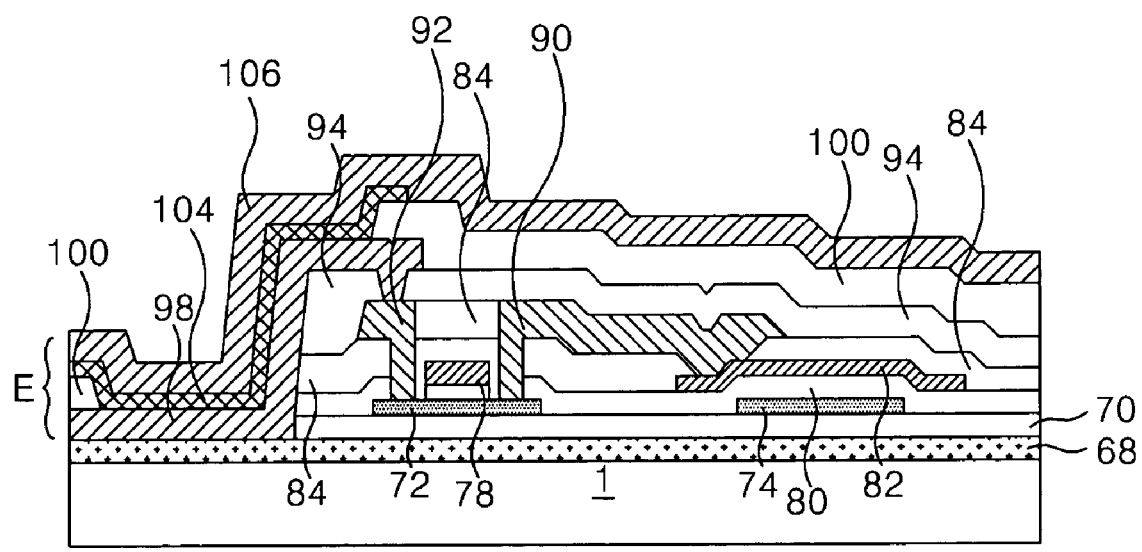

In FIG. 5J, the organic EL layer 104 and the cathode 106 may be sequentially formed on the substrate 1, such that the organic EL layer 104 contacts the anode 98 in the region 102 to form the organic EL diode E.

Figure 6:
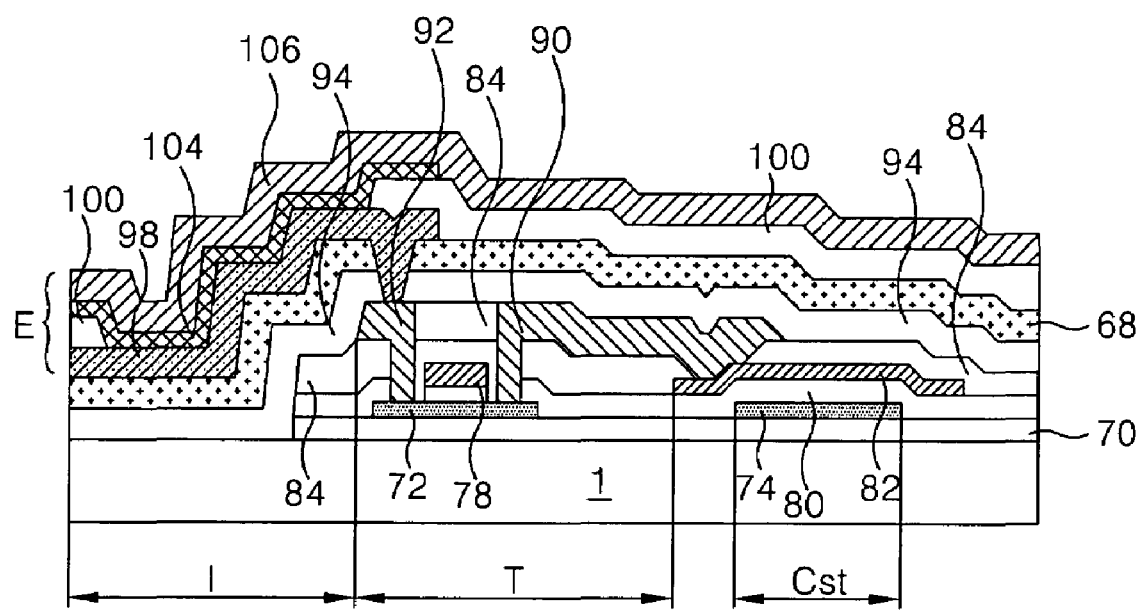
FIG. 6 is a sectional view of another exemplary active matrix type organic EL display panel device according to the present invention.

FIG. 6 is a sectional view of another exemplary active matrix type organic EL display panel device according to the present invention. In FIG. 6, an active matrix type organic EL display panel device may include an insulating substrate 1, a buffer layer 70 formed on the insulating substrate 1, a thin film transistor T formed on a first region of the buffer layer 70, a storage capacitor Cst formed on a second region of the buffer layer 70, and an organic EL diode E formed on the substrate 1 in a light emitting region I. In particular, the buffer layer 70 may be formed exposing a region of the substrate 1 in the light emitting region I, and a third insulating layer 94 and a low refractive thin film 68 may be formed on the exposed region of the substrate 1, such that the organic EL diode E formed directly on the third insulating layer 94 and the low refractive thin film 68. The thin film transistor T may have a deposition structure including a semiconductor layer 72 formed on the buffer layer 70, a gate electrode 78 formed on the semiconductor layer 72, and source and drain electrodes 90 and 92 formed on the semiconductor layer 72. In addition the storage capacitor Cst may include a capacitor electrode 74 formed on the buffer layer 70, and a power electrode 82 formed opposite to the capacitor 74 with a first insulating layer 80 therebetween. Further, the organic EL diode E may include an anode 98 formed on the low refractive thin film 68, a cathode 106 formed opposite to the anode 98 with an organic EL layer 104 therebetween. Also, the organic EL layer 104 may include a hole injection layer (not shown), a hole transport layer (not shown), an electron transport layer (not shown), and an electron injection layer (not shown) formed sequentially between the anode and cathode 98 and 106. A protection layer 100 also may be formed between a portion of the organic EL layer 104 and the anode 98.

In addition, the source electrode 90 of the thin film transistor T may extend over a second insulating layer 84, such that a portion of the source electrode 90 contacts the power electrode 82 of the storage capacitor Cst. Also, the anode 98 of the organic EL diode E may extend over the third insulating layer 94 and the low refractive thin film 68, such that a portion of the anode 98 contacts the drain electrode 92 of the thin film transistor T. In particular, when a gate signal applied by a gate line GL (shown in FIG. 1) of the organic EL display panel device is enabled, the thin film transistor may be electrically connected to the storage capacitor Cst and the organic EL diode E. Subsequently, the organic EL diode E may emit light corresponding to a pixel signal applied by a data line DL (shown in FIG. 1) of the organic EL display panel device.

Accordingly, the organic EL display panel device may have a lower light emission scheme where an emitted light is transmitted through the anode 98, which is a lower electrode of the organic EL diode E. For example, the anode 98 may transmit the emitted light at the organic EL layer 104, the cathode 106 may inject electrons smoothly into the organic EL layer 104 because of its low work function. Thus, in the active matrix type organic EL display panel device, light emitted from the organic EL layer 104 may be radiated through the substrate 1 without transmitting through the buffer layer 70 and the first and second insulating layers 80 and 84, thereby improving brightness, brightness uniformity, and light emission efficiency.

Figure 7A:
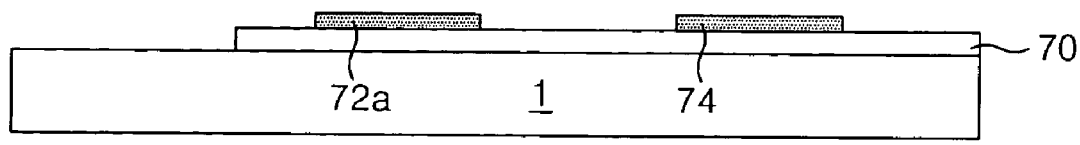
FIGS. 7A-7I are section views of an exemplary method of fabricating the active matrix type organic EL display panel device of FIG. 6.

FIGS. 7A-7I are section views of an exemplary method of fabricating the active matrix type organic EL display panel device of FIG. 6. In FIG. 7A, the buffer layer 70 may be first formed on the substrate exposing a portion of the substrate 1 in the light emission region I. The buffer layer 70 may be formed by depositing a first insulating layer on the entire surface of the substrate 1 and patterned by a first mask process. Then, the semiconductor layer 72 and the capacitor electrode 74 may be formed simultaneously or sequentially by depositing polycrystalline silicon on an entire surface of the buffer layer 70 and patterned by a second mask process.

Figure 7B:
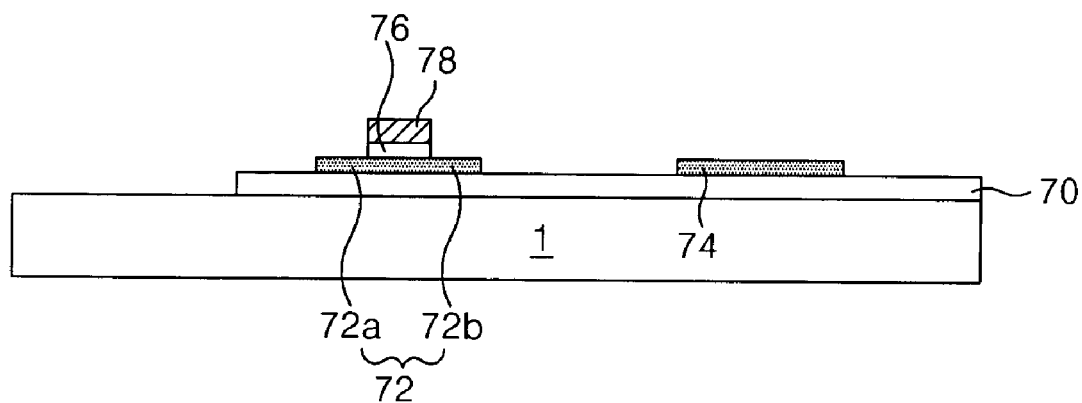

In FIG. 7B, a gate insulating film 76 and the gate electrode 78 may be formed on a central region of the semiconductor layer 72. The gate insulating layer 76 and the gate electrode 78 may be formed by sequentially depositing a second insulating material and a first metal material on the semiconductor layer 72 and patterned by a third mask process, such that the semiconductor layer has two exposed regions 72a and 72b.

Figure 7C:
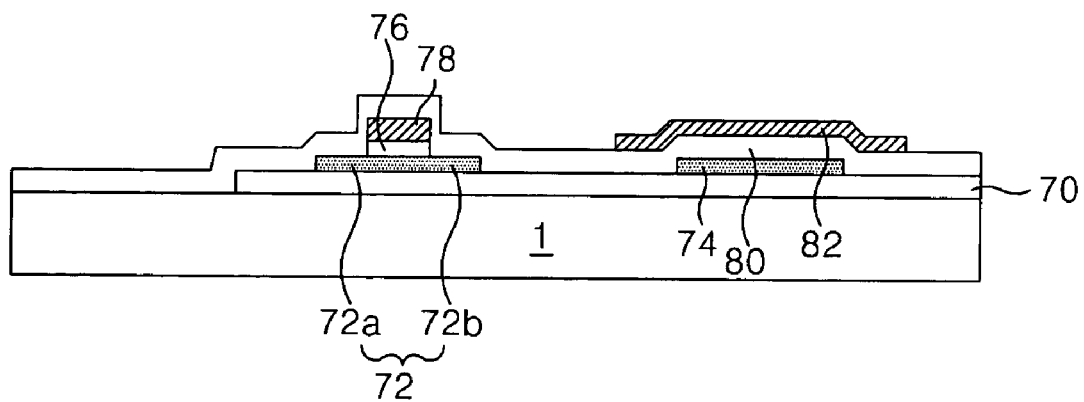

In FIG. 7C, the first insulating layer 80 may be formed on the entire surface of the substrate 1. The first insulating layer 80 may be formed by depositing a third insulating material on the substrate 1. Then, the power electrode 82 may be formed on the first insulating layer 80 above the capacitor electrode 74. The power electrode 82 may be formed by depositing a second metal material on the first insulating layer 80 and patterned by a fourth mask process.

Figure 7D:
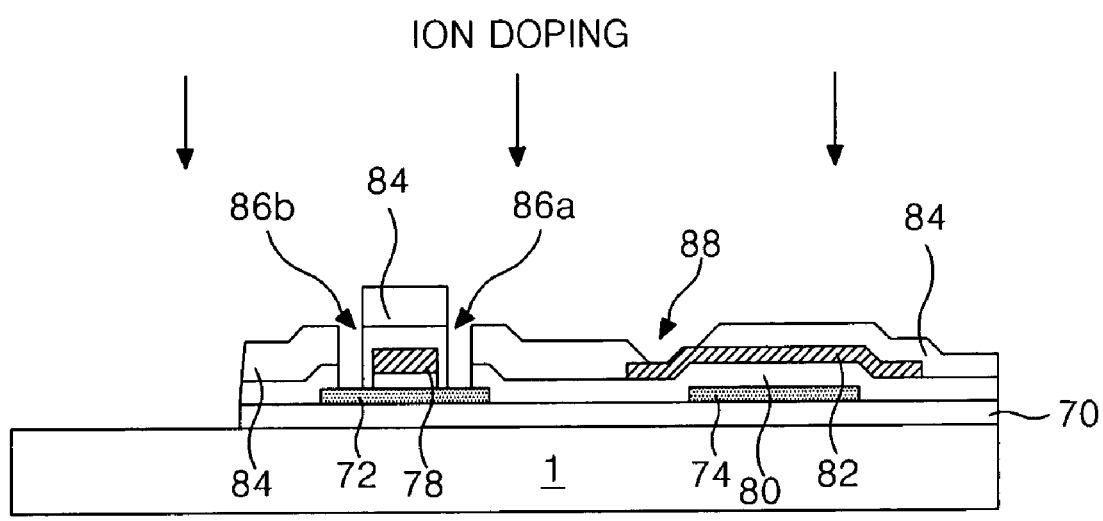

In FIG. 7D, the second insulating layer 84 may be formed on the substrate 1. A third insulating material may be deposited on the entire surface of the substrate 1 covering the first insulating layer 80 and the power electrode 82. Then, the third insulating material and the first insulating layer 80 may be patterned to expose the region of the substrate 1 in the light emission region I similar to the buffer layer 70. Also, the first and second insulating layers 80 and 84 may be further patterned to form first and second ohmic contact holes 86a and 86b exposing the regions 72a and 72b of the semiconductor layer 72. Further, the second insulating layer 84 may be further patterned to form a capacitor contact hole 88 exposing a region of the power electrode 82. Then, the substrate 1 may undergo an ion doping process, thereby forming source and drain areas containing impurities in the semiconductor layer 72.

Figure 7E:
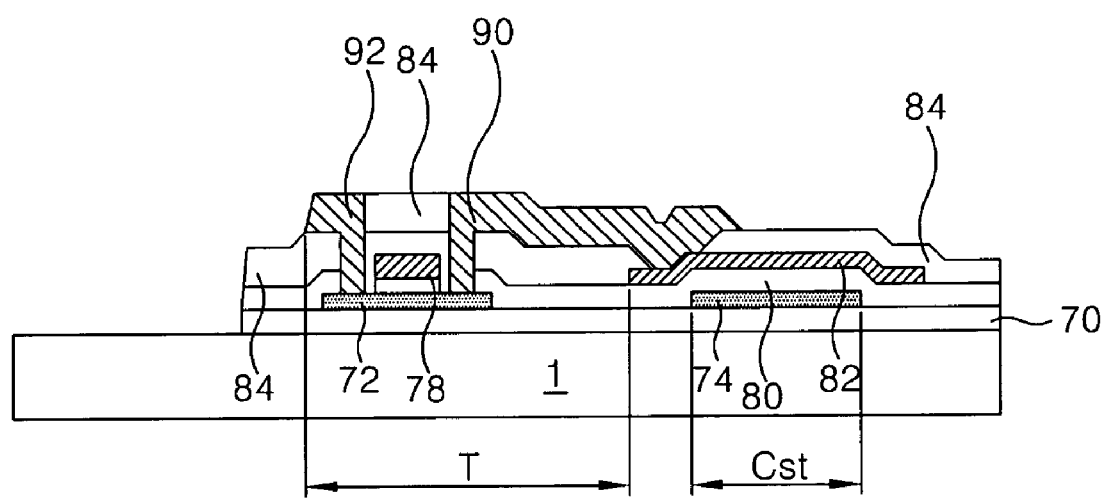

In FIG. 7E, the source and drain electrodes 90 and 92 may be formed in the first and second ohmic contact holes 86a and 86b (shown in FIG. 7D). The source and drain electrodes 90 and 92 may be formed by depositing a third metal material and patterned by a sixth mask process, such that the source electrode 90 extends over the second insulating layer 84 and contacts the exposed region of the power electrode 82 through the capacitor contact hole 88 (shown in FIG. 7D). Accordingly, the thin film transistor T and the storage capacitor Cst may be completely formed on the substrate 1. In particular, the capacitor electrode 74 may connect to the gate electrode 78, and the power electrode 82 may be connected to a power supply line VDD (shown in FIG. 1) and be parallel to a data line DL (shown in FIG. 1).

Figure 7F:
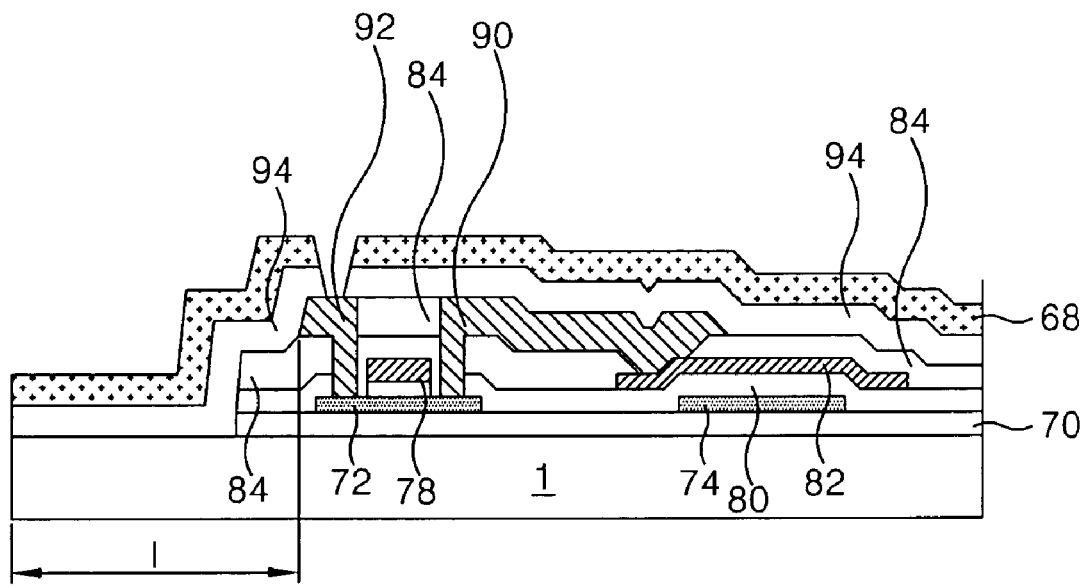

In FIG. 7F, the third insulating layer 94 may be formed on the entire surface of the substrate 1 by depositing a fourth insulating material on the entire surface of the substrate 1. Then, the low refractive thin film 68 may be formed on an entire surface of the third insulating layer 94 by depositing one of silica aerogel and silica gel. Then, the third insulating layer 94 and the low refractive thin film 68 may be patterned by a seventh mask process to form a drain contact hole exposing a portion of the drain electrode 92.

Figure 7G:
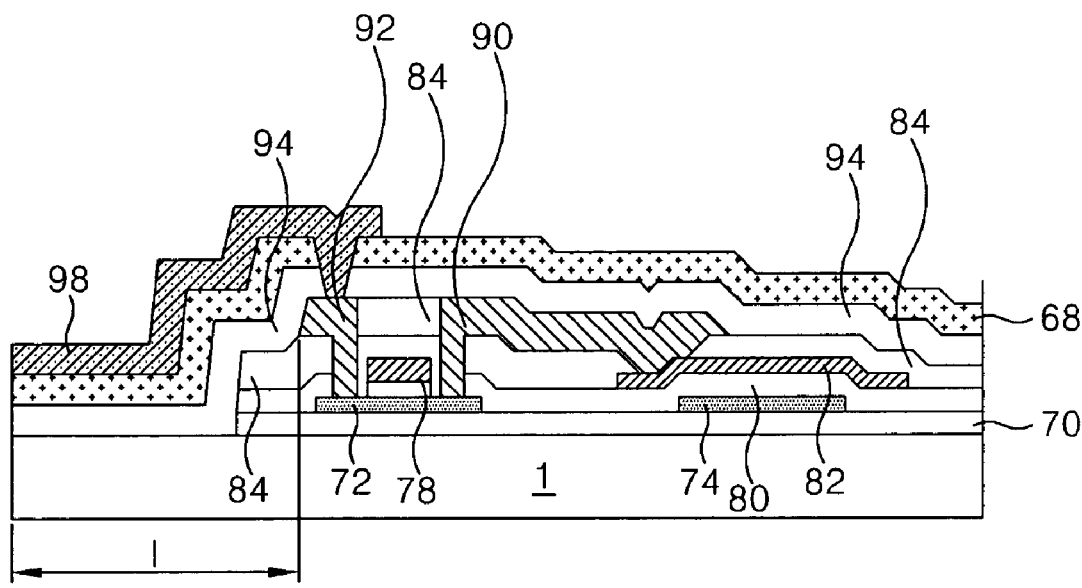

In FIG. 7G, the anode 98 may be formed within the light emission region I and on the low refractive thin film 68 contacting the exposed portion of the drain electrode 92. The anode 98 may be formed by depositing a transparent conductive material on the substrate 1 and patterned by an eighth mask process.

Figure 7H:
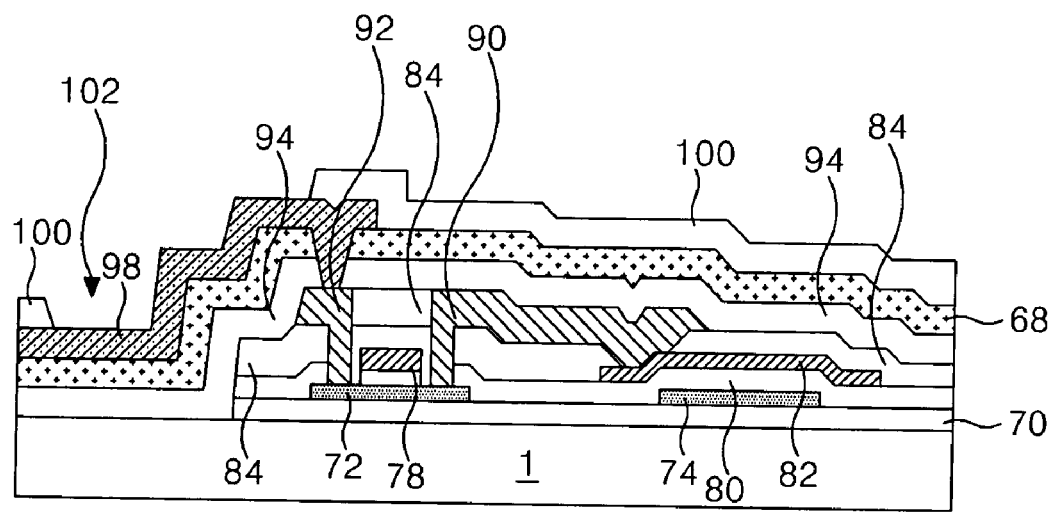

In FIG. 7H, the protection layer 100 may be formed on the substrate 1 by depositing a fifth insulating material on the entire surface of the substrate an patterned by a ninth mask process. The protection layer 100 may be patterned to partially cover the anode 98 and to expose a region 102. Also, the protection layer 100 may cover the thin film transistor T, thereby protecting the thin film transistor T from moisture and impurities.

Figure 7I:
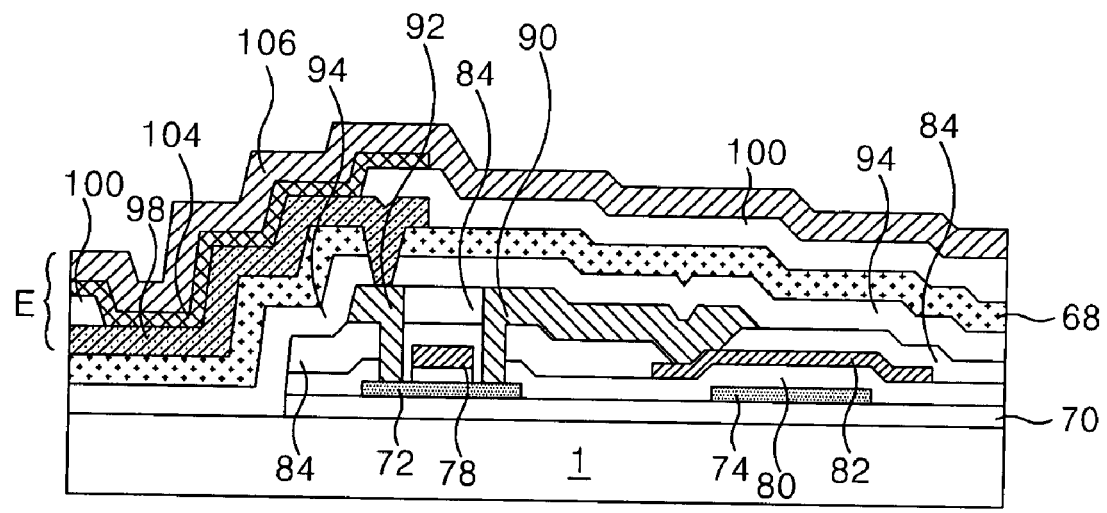

In FIG. 7I, the organic EL layer 104 and the cathode 106 may be sequentially formed on the substrate 1, such that the organic EL layer 104 contacts the anode 98 in the region 102 to form the organic EL diode E.

Figure 8:
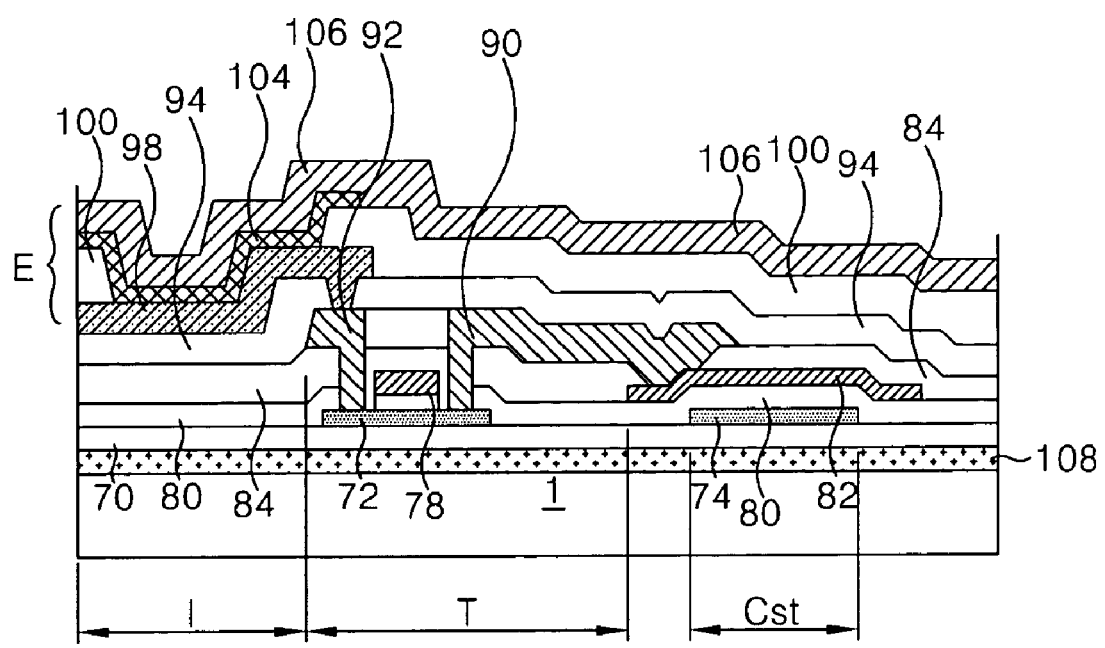
FIG. 8 is a sectional view of another exemplary active matrix type organic EL display panel device according to the present invention.

FIG. 8 is a sectional view of another exemplary active matrix type organic EL display panel device according to the present invention. In FIG. 8, an active matrix type organic EL display panel device may be arranged in a similar manner as shown in FIG. 1. In addition, the active matrix type organic EL display panel device may include an insulating substrate 1, a low refractive thin film 108 formed on an entire surface of the substrate 1, a buffer layer 70 formed on the low refractive thin film 108, a thin film transistor T formed on a first region of the buffer layer 70, a storage capacitor Cst formed on a second region of the buffer layer 70, and organic EL diode E formed on the substrate 1 in a light emitting region I.

The thin film transistor T may have a deposition structure including a semiconductor layer 72 formed on the buffer layer 70, a gate electrode 78 formed on the semiconductor layer 72, and source and drain electrodes 90 and 92 formed on the semiconductor layer 72. In addition, the storage capacitor Cst may include a capacitor electrode 74 formed on the buffer layer 70, and a power electrode 82 formed opposite to the capacitor electrode 74 with a first insulating layer 80 therebetween. Further, the organic EL diode E may include an anode 98 formed on the low reflective thin film 68, the first insulating layer 80, a second insulating layer 84 and a third insulating layer 98. The organic EL diode E may also include a cathode 106 formed opposite to the anode 98 with an organic EL layer 104 therebetween. Also, the organic EL layer 104 may include a hole injection layer (not shown), a hole transport layer (not shown), an electron transport layer (not shown), and an electron injection layer (not shown) formed sequentially between the anode and cathode 98 and 106. A protection layer 100 also may be formed between a portion of the organic EL layer 104 and the anode 98. The anode 98 may be formed of a transparent conductive material, and the cathode 106 may be formed of a metal having a low work function.

In addition, the source electrode 90 of the thin film transistor T may extend over the second insulating layer 84, such that a portion of the source electrode 90 contacts the power electrode 82 of the storage capacitor Cst. Also, the anode 98 of the organic EL diode E may extend over the third insulating layer 94, such that a portion of the anode 98 contacts the drain electrode 92 of the thin film transistor T. In particular, when a gate signal applied by a gate line GL (shown in FIG. 1) of the organic EL display panel device is enabled, the thin film transistor may be electrically connected to the storage capacitor Cst and the organic EL diode E. Subsequently, the organic EL diode E may emit light corresponding to a pixel signal applied by a data line DL (shown in FIG. 1) of the organic EL display panel device. Accordingly, the organic EL display panel device may have a lower light emission scheme where an emitted light is transmitted through the anode 98, which is a lower electrode of the organic EL diode E. For example, the anode 98 may transmit the emitted light at the organic EL layer 104, the cathode 106 may inject electrons smoothly into the organic EL layer 104 because of its low work function.

Accordingly, in the active matrix type organic EL display panel device according to the present invention, light emitted from the light emission layer of the organic EL layer 104 may be radiated through the low refractive thin film 108 and the substrate 1, thereby improving brightness and brightness uniformity.

Figure 9A:
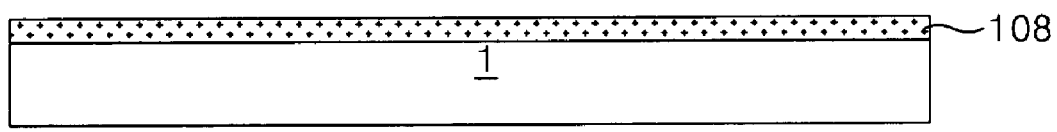
FIGS. 9A-9J are sectional views of an exemplary method of fabricating the active matrix type organic EL display panel device of FIG. 8.

FIGS. 9A-9I are sectional views of an exemplary method of fabricating the active matrix type organic EL display panel device of FIG. 8. In FIG. 9A, the low refractive thin film 108 may be first formed on the entire surface of the insulating substrate 1 by depositing one of silica aerogel and silica gel.

Figure 9B:
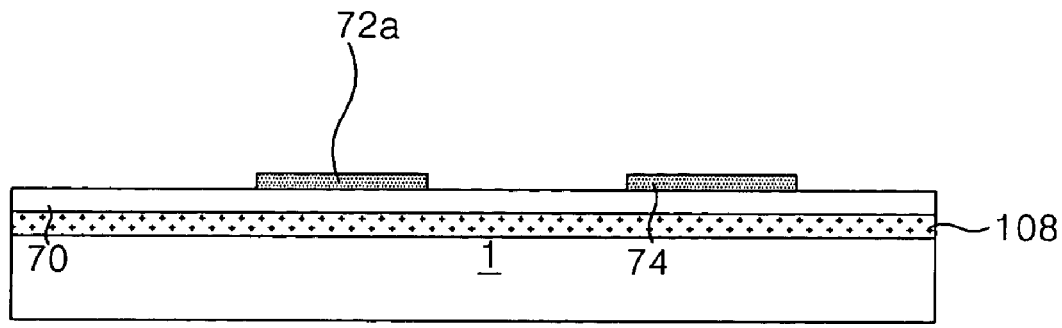

In FIG. 9B, the buffer layer 70 may be formed on a portion of the low refractive thin film 108. The buffer layer 70 may be formed by depositing a first insulating material on an entire surface of the low refractive thin film 108. Then, the semiconductor layer 72 and the capacitor electrode 74 may be formed simultaneously or sequentially by depositing polycrystalline silicon on an entire surface of the buffer layer 70 and patterned by a first mask process.

Figure 9C:
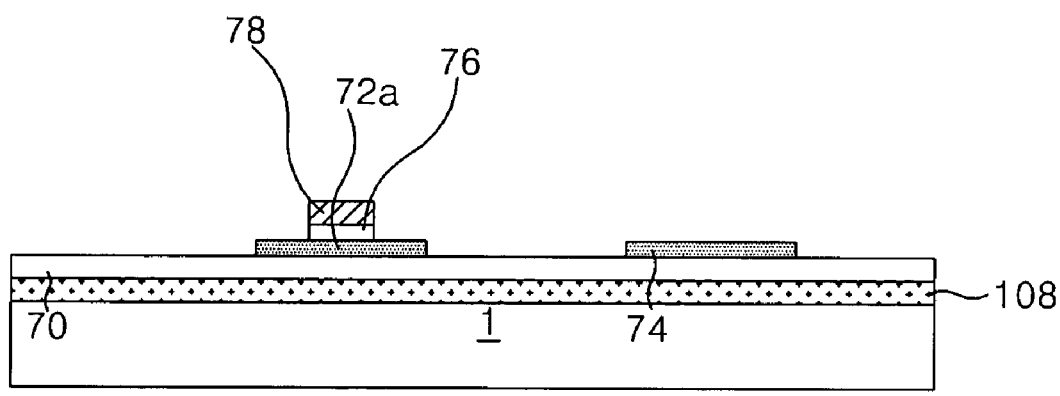

In FIG. 9C, a gate insulating film 76 and the gate electrode 78 may be formed on a central region of the semiconductor layer 72. The gate insulating layer 76 and the gate electrode 78 may be formed by sequentially depositing a second insulating material and a first metal material on the semiconductor layer 72 and patterned by a second mask process, such that the semiconductor layer 72 has two exposed regions at its ends.

Figure 9D:
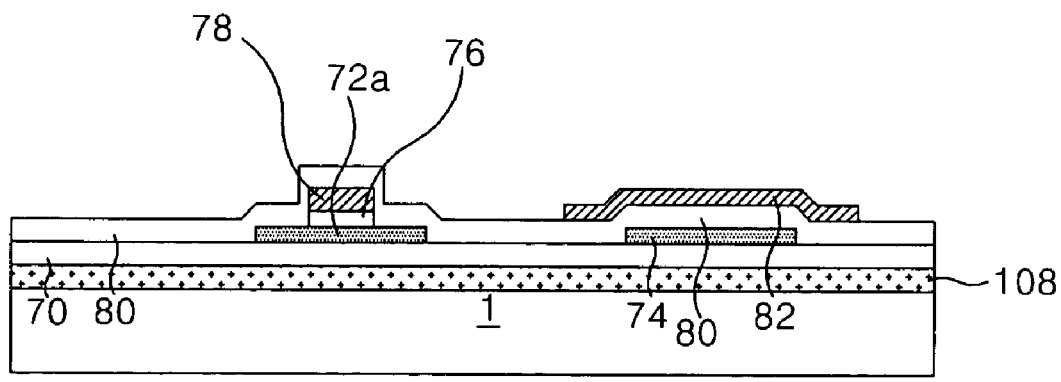

In FIG. 9D, the first insulating layer 80 may be formed on the entire surface of the substrate 1. The first insulating layer 80 may be formed by depositing a third insulating material on the entire surface of the substrate 1. Then, the power electrode 82 may be formed on the first insulating layer 80 above the capacitor electrode 74. The power electrode 82 may be formed by depositing a second metal material on the first insulating layer 80 and patterned by a third mask process.

Figure 9E:
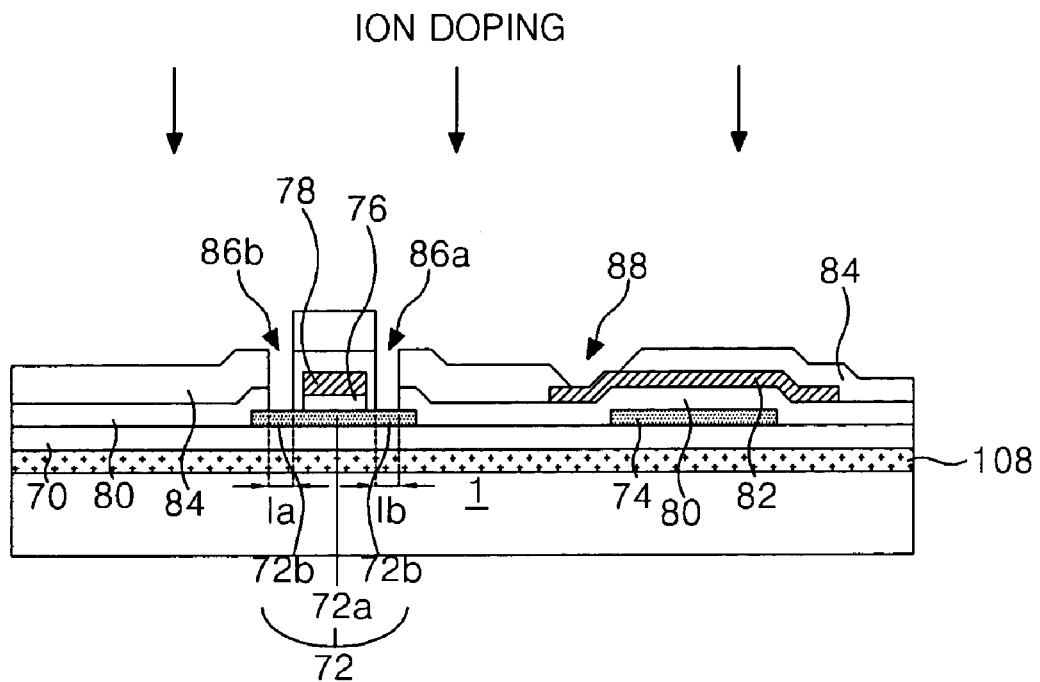

In FIG. 9E, the second insulating layer 84 may be formed on the substrate 1 by depositing a third insulating material on the substrate 1 and patterned by a fourth mask process. In particular, the second insulating layer 84 may be on the entire surface of the substrate 1. In addition, the first and second insulating layers 80 and 84 may be patterned to form first and second ohmic contact holes 86*a* and 86*b* exposing the regions 72*a* and 72*b* of the semiconductor layer 72. Further, the second insulating layer 84 may be further patterned to form a capacitor contact hole 88 exposing a region of the power electrode 82. Then, the substrate 1 may undergo an ion doping process, thereby forming source and drain areas Ia and Ib containing impurities.

Figure 9F:
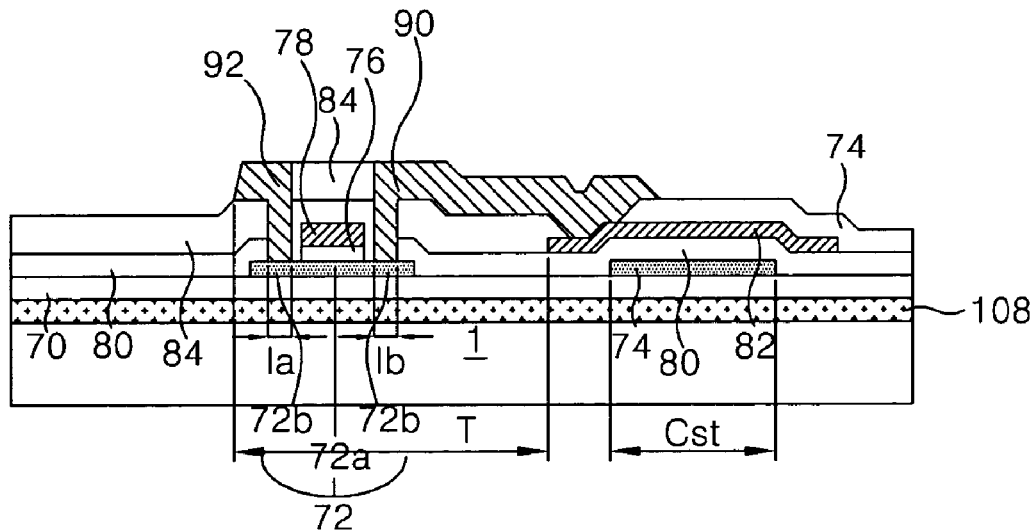

In FIG. 9F, the source and drain electrodes 90 and 92 may be formed in the first and second ohmic contact holes 86*a* and 86*b* (shown in FIG. 5E). The source and drain electrodes 90 and 92 may be formed by depositing a third metal material and patterned by a fifth mask process, such that the source electrode 90 extends over the second insulating layer 84 contacting the exposed region of the power electrode 82 through the capacitor contact hole 88 (shown in FIG. 5E). Accordingly, the thin film transistor T and the storage capacitor Cst may be completely formed on the substrate 1. In particular, the capacitor electrode 74 may connect to the gate electrode 78, and the power electrode 82 may be connected to a power supply line VDD (shown in FIG. 1) and be parallel to a data line DL (shown in FIG. 1).

Figure 9G:
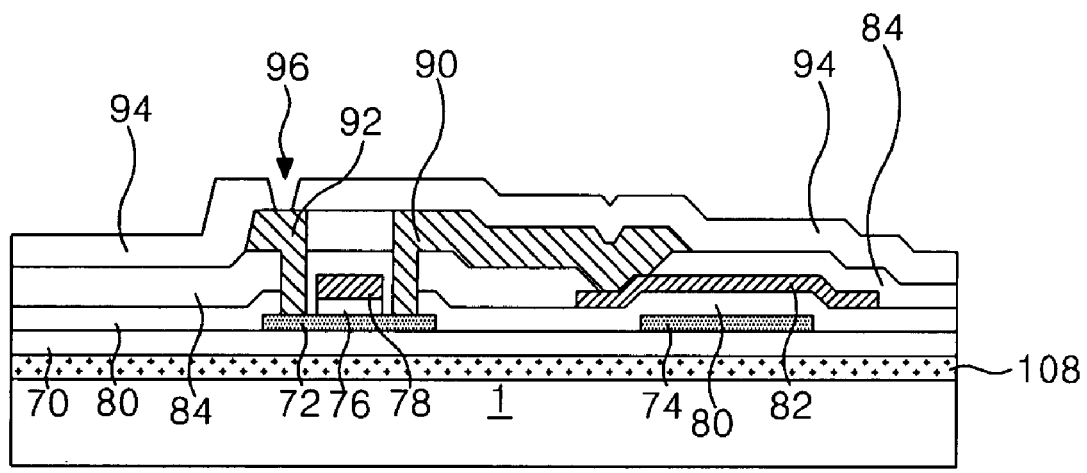

In FIG. 9G, the third insulating layer 94 may be formed on the substrate 1 by depositing a fourth insulating material on the entire surface of the substrate 1 and patterned by a sixth mask process. The third insulating layer 94 may be patterned to expose a portion 96 of the drain electrode 92.

Figure 9H:
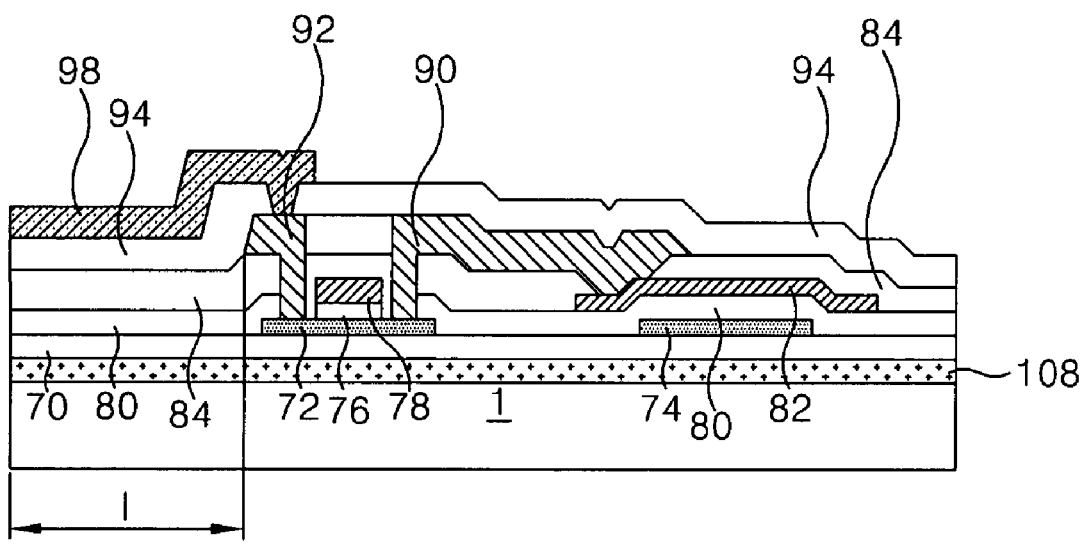

In FIG. 9H, the anode 98 may be formed within the light emission region I and on the third insulating layer 94 contacting the exposed portion 96 (shown in FIG. 9G) of the drain electrode 92. The anode 98 may be formed by depositing a transparent conductive material on the substrate 1 and patterned by a seventh mask process.

Figure 9I:
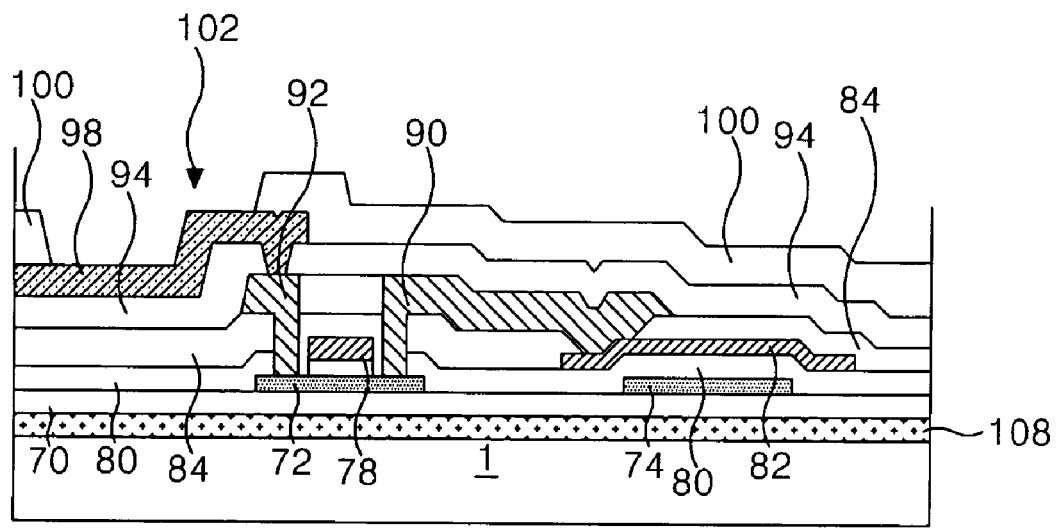

In FIG. 9I, the protection layer 100 may be formed on the substrate 1 by depositing a fifth insulating material on the entire surface of the substrate 1 and patterned by an eighth mask process. The protection layer 100 may be patterned to partially cover the anode 98 and to expose a region 102. Also, the protection layer 100 may cover the thin film transistor T, thereby protecting the thin film transistor T from moisture and impurities.

Figure 9J:
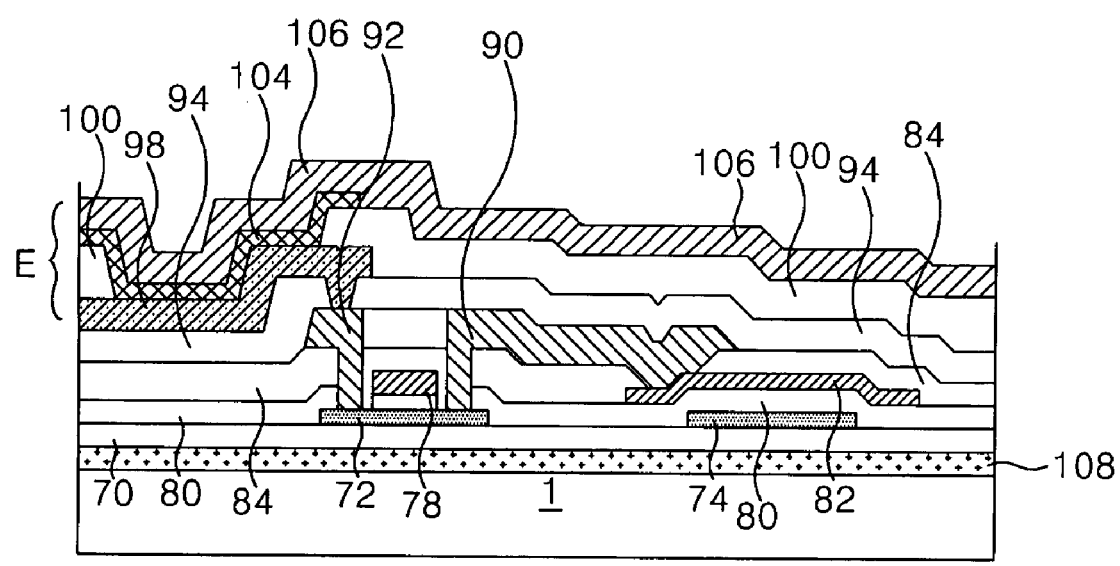

In FIG. 9J, the organic EL layer 104 and the cathode 106 may be sequentially formed on the substrate 1, such that the organic EL layer 104 contacts the anode 98 in the region 102 to form the organic EL diode E.

It will be apparent to those skilled in the art that various modifications and variations can be made in the active matrix type organic electro luminescence display panel device and the method of fabricating the same of the present invention without departing from the spirit or scope of the invention. Thus, it is intended that the present invention cover the modifications and variations of this invention provided they come within the scope of the appended claims and their equivalents.

What is claimed is:

1. An active matrix organic electro luminescence display panel device comprising:
    a substrate;
    at least one low refractive thin film formed directly on the substrate;
    an organic electro luminescence diode formed on the low refractive thin film to selectively emit light;
    a switching device formed on the low refractive thin film for selectively driving the organic electro luminescence diode; and
    a capacitor for sustaining a light emission of the organic electro luminescence diode, wherein the organic electro luminescence diode includes:
    a first electrode formed of transparent conductive material on the low refractive thin film and connected to the switching device;
    an organic light emission layer including an organic luminous material on the first electrode; and
    a second electrode including a metal material to cover the organic light emission layer, the switching device, and the capacitor, and
    wherein the switching device includes:
    a buffer layer formed on the substrate;

a semiconductor layer formed at a predetermined area on the buffer layer;

a gate insulating film and a gate electrode sequentially deposited on the semiconductor layer;

a drain electrode connected to the semiconductor layer and connected to the first electrode of the organic electro luminescence diode; and a source electrode connected to the semiconductor layer and connected to the capacitor.

2. The device according to claim 1, wherein the capacitor includes:

a capacitor electrode formed on the buffer layer and separated from the semiconductor layer with a gap therebetween;

a first insulating layer covering the capacitor electrode; and a power electrode overlapping the capacitor electrode on the first insulating layer and connected to the source electrode.

3. The device according to claim 1, further comprising:

a second insulating layer covering the switching device and the capacitor, wherein the second insulating layer includes a contact hole and a portion of the first electrode is within the contact hole; and a third insulating layer formed between the second insulating layer and the second electrode.

4. The device according to claim 1, further comprising at least one fourth insulating layer formed between the low refractive thin film and the first electrode.

5. An active matrix organic electro luminescence display panel device comprising:

a substrate;

at least one low refractive thin film formed on the substrate;

an organic electro luminescence diode formed on the low refractive thin film to selectively emit light;

a switching device formed on the low refractive thin film for selectively driving the organic electro luminescence diode;

a first insulating layer formed between the substrate and the low refractive thin film to cover the switching device; and a capacitor formed between the substrate and the low refractive thin film to sustain a light emission of the organic electro luminescence diode, the first insulating layer covering the capacitor, wherein a refractive rate (n) of the low refractive thin film is less than or equal to 1.5.

6. The device according to claim 5, wherein the organic electro luminescence diode includes:

a first electrode formed of transparent conductive material on the low refractive thin film, wherein the low refractive thin film includes a contact hole and a portion of the first electrode is within the contact hole contacting the switching device;

an organic light emission layer formed of organic luminous material on the first electrode; and a second electrode formed of metal material to cover the organic light emission layer, the switching device and the capacitor.

7. The device according to claim 6, wherein the switching device includes:

a buffer layer formed on the substrate;

a semiconductor layer formed at a predetermined area on the buffer layer;

a gate insulating film and a gate electrode sequentially deposited on the semiconductor layer;

a drain electrode connected to the semiconductor layer and connected to the first electrode of the organic electro luminescence diode; and a source electrode connected to the semiconductor layer and connected to the capacitor.

8. The device according to claim 7, wherein the capacitor includes:

a capacitor electrode formed on the buffer layer and separated from the semiconductor layer with a gap therebetween;

a first insulating layer covering the capacitor electrode;

a second insulating layer covering the capacitor electrode; and a power electrode overlapping the capacitor electrode on the first insulating layer and connected to the source electrode.

* * * * *